(12) United States Patent
Kariyazaki

(10) Patent No.: US 8,975,528 B2
(45) Date of Patent: Mar. 10, 2015

(54) ELECTRONIC DEVICE, WIRING SUBSTRATE, AND METHOD FOR MANUFACTURING ELECTRONIC DEVICE

(75) Inventor: Shuuichi Kariyazaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 316 days.

(21) Appl. No.: 13/590,470

(22) Filed: Aug. 21, 2012

(65) Prior Publication Data

US 2013/0077275 A1 Mar. 28, 2013

(30) Foreign Application Priority Data

Sep. 27, 2011 (JP) ................................ 2011-211399

(51) Int. Cl.
| | |
|---|---|
| *H05K 1/03* | (2006.01) |
| *H05K 1/09* | (2006.01) |
| *H05K 1/16* | (2006.01) |
| *H05K 1/11* | (2006.01) |
| *H05K 7/00* | (2006.01) |
| *B23K 31/02* | (2006.01) |
| *H01L 23/498* | (2006.01) |
| *H01L 23/50* | (2006.01) |
| *H05K 1/02* | (2006.01) |

(52) U.S. Cl.
CPC .......... *H05K 1/111* (2013.01); *H01L 23/49838* (2013.01); *H01L 23/50* (2013.01); *H01L 2224/16225* (2013.01); *H01L 2224/32225* (2013.01); *H01L 2224/73204* (2013.01); *H01L 2924/15311* (2013.01); *H05K 1/0268* (2013.01); *H05K 2201/09663* (2013.01); *H05K 2201/10734* (2013.01); *H05K 2201/10977* (2013.01); *H01L 2224/73253* (2013.01)

USPC ........... 174/255; 174/257; 174/260; 174/261; 174/263; 361/777; 361/783; 228/179.1

(58) Field of Classification Search
CPC ........ H05K 1/111; H05K 3/3452; H05K 3/28
USPC .................. 174/255, 260, 261, 263, 250, 257; 361/783, 777; 228/179.1
See application file for complete search history.

(56) References Cited

U.S. PATENT DOCUMENTS

| 2002/0125043 | A1* | 9/2002 | Yoshida ......................... 174/261 |
| 2004/0040741 | A1* | 3/2004 | Wienrich et al. ............... 174/257 |

(Continued)

FOREIGN PATENT DOCUMENTS

| JP | 11-040563 | 2/1999 |
| JP | 11-177040 | 7/1999 |
| JP | 2000-323519 | 11/2000 |

*Primary Examiner* — Timothy Thompson
*Assistant Examiner* — Sherman Ng
(74) *Attorney, Agent, or Firm* — Young & Thompson

(57) ABSTRACT

Even in an electronic device where electrodes are coupled electrically using a solder, sections to which electrodes of an electronic component are coupled are switched by a method other than changing circuits of the electronic component or changing circuits of a wiring substrate.

The electronic device includes: a wiring substrate having two or more first electrodes over one surface thereof; and an electronic component having, over one surface thereof, two or more second electrodes arranged corresponding to the two or more first electrodes, respectively. At least one of the first electrodes is a specific electrode divided into two or more divided portions, and the divided portions are coupled to different wirings, respectively. Further, at least one of the divided portions is coupled to a corresponding second electrode through a solder.

20 Claims, 23 Drawing Sheets

(56) References Cited

U.S. PATENT DOCUMENTS

| | | | |
|---|---|---|---|
| 2007/0119618 A1* | 5/2007 | Nishitani et al. | 174/260 |
| 2008/0245554 A1* | 10/2008 | Pan | 174/260 |
| 2010/0181102 A1* | 7/2010 | Abe et al. | 174/260 |
| 2010/0224986 A1* | 9/2010 | Kojima et al. | 257/692 |

* cited by examiner

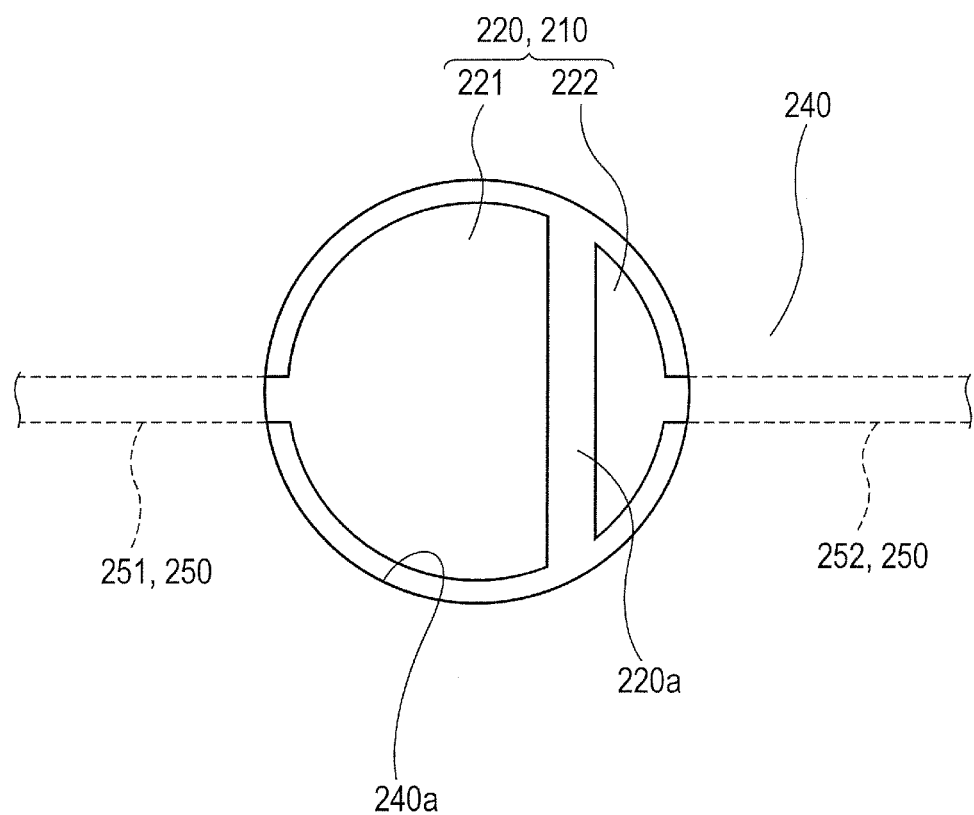

FIG. 20
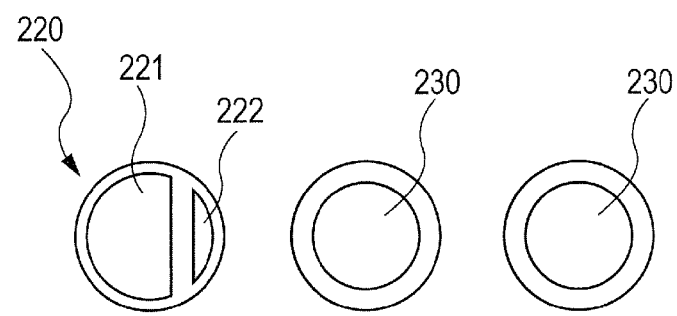
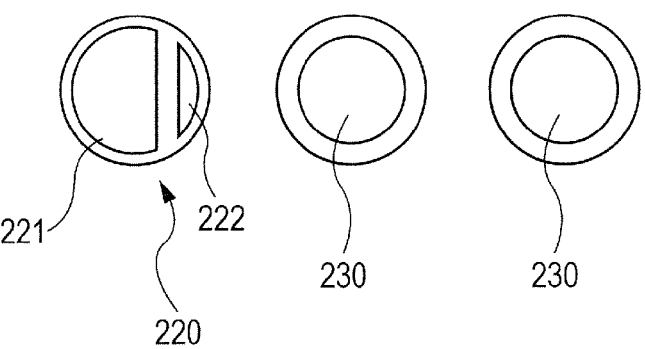

ELECTRONIC DEVICE, WIRING SUBSTRATE, AND METHOD FOR MANUFACTURING ELECTRONIC DEVICE

CROSS-REFERENCE TO RELATED APPLICATIONS

The disclosure of Japanese Patent Application No. 2011-211399 filed on Sep. 27, 2011 including the specification, drawings and abstract is incorporated herein by reference in its entirety.

BACKGROUND

The present invention relates to an electronic device, a wiring substrate, and a method for manufacturing an electronic device.

In the case of a semiconductor device using a bonding wire, it is possible to change some of the functions of a semiconductor chip (hereafter, simply called a "chip") as required by switching sections to be coupled with a bonding wire according to a bonding option. As a result, it becomes possible, among a plurality of uses, to share the chip or to share a wiring substrate over which the chip is mounted. A general bonding option is realized, when wire-bonding the chip with the wiring substrate, by switching sections to be coupled through a bonding program.

A method, other than switching the sections to be coupled by the bonding program, to realize the bonding option is the one disclosed in Patent Documents 1 to 3.

According to the method of Patent Document 1, a bonding option is realized by switching circuits of a chip in such a way that two or more wirings are coupled to an electrode of the chip and, among those wirings, in order to obtain a desired characteristic, the wirings except required wirings are cut off.

According to a method of Patent Document 2, when a chip is mounted over a TAB tape in which a pattern is formed, sections to be coupled with a data terminal of an electrode of the chip are switched by changing a position at which the chip is mounted.

According to a method of Patent Document 3, there are used a bonding pad having: a first electrode coupled to a signal line; and a second electrode provided outside the first electrode through a slit and coupled to another signal line. Subsequently, a bonding option is realized by switching states where a bonding wire is coupled to the first electrode alone and where the bonding wire is coupled to both the first and second electrodes.

[Patent Document 1] Japanese Unexamined Patent Publication No. Hei 11(1999)-40563
[Patent Document 2] Japanese Unexamined Patent Publication No. Hei 11(1999)-177040
[Patent Document 3] Japanese Unexamined Patent Publication No. 2000-323519

SUMMARY

However, in the case of a semiconductor device which is flip-chip bonded, a chip and a wiring substrate are coupled with use of a solder. As a result, a section to be directly coupled with the solder cannot be changed easily. Therefore, in the case of the semiconductor device which is flip-chip bonded, it is commonly performed that circuits are switched by changing chips for each use or changing circuit patterns over the wiring substrate for each use. In such cases, however, it is necessary to prepare a combination of chips and the wiring substrate for each circuit type, which is inefficient.

Therefore, like a semiconductor device which is flip-chip bonded, in an electronic device where electrodes are coupled electrically with use of a solder, such a method is desired that sections to which the electrodes of an electronic component are coupled are switched by a method other than changing circuits of the electronic component such as a chip or changing circuits of the wiring substrate.

According to the present invention, there is provided an electronic device, including: a wiring substrate having two or more first electrodes over one surface thereof; and an electronic component having, over one surface thereof, two or more second electrodes arranged corresponding to the two or more first electrodes, respectively. At least one of the first electrodes is a specific electrode divided into two or more divided portions. The divided portions are coupled to different wirings, respectively, and at least one of the divided portions is coupled with the corresponding second electrode through a solder.

According to the present invention, it is possible to provide an electronic device of a configuration where a section to which the second electrode is coupled is chosen by at least one of the two or more divided portions of the specific electrode being coupled to a corresponding second electrode through a solder. That is, like a semiconductor device which is flip-chip bonded, even in an electronic device where electrodes are electrically coupled with each other using the solder, sections to which electrodes of the electronic component are coupled can be switched by a technique other than changing circuits of electronic components, such as a chip, or by changing circuits of the wiring substrate.

Further, according to the present invention, there is provided a wiring substrate including a substrate body and two or more first electrodes formed over one surface of the substrate body. At least one of the first electrodes is a specific electrode divided into two or more divided portions. The divided portions are coupled to different wirings, respectively. At least one of the remaining first electrodes is a regular electrode which is not divided into two or more portions but the whole of it is formed integrally. A diameter of the regular electrode is greater than a spacing between the divided portions.

Still further, according to the present invention, there is provided a method for manufacturing an electronic device, including the steps of: mounting, over a wiring substrate having two or more first electrodes over one surface thereof, an electronic component having, over one surface thereof, two or more second electrodes provided corresponding to the two or more first electrodes, at least one of the first electrodes being a specific electrode which is divided into two or more of divided portions, the divided portions being coupled to different wirings, respectively, and solder balls being formed over the second electrodes, respectively; and reflowing the solder ball and coupling each of the second electrodes with the first electrodes through the solder. In the coupling step, at least one of the divided portions is coupled with the corresponding second electrode through the solder.

According to the present invention, like a semiconductor device flip-chip bonded, even in an electronic device where electrodes are coupled electrically with use of a solder, sections to which the electrodes of the electronic component are coupled can be switched by a method other than changing circuits of the electronic component such as a chip or changing circuits of the wiring substrate.

BRIEF DESCRIPTION OF THE DRAWINGS

FIG. 2 is a plan view showing a specific electrode of a wiring substrate of a semiconductor device according to the first embodiment;

FIGS. 12A and 12B are diagrams for showing a semiconductor device according to a second embodiment, in which FIG. 12A is a sectional side view and FIG. 12B is an enlarged sectional view;

FIG. 20 is a plan view for showing an example of arrangement when two or more specific electrodes are arranged;

DETAILED DESCRIPTION

Figure 1A:
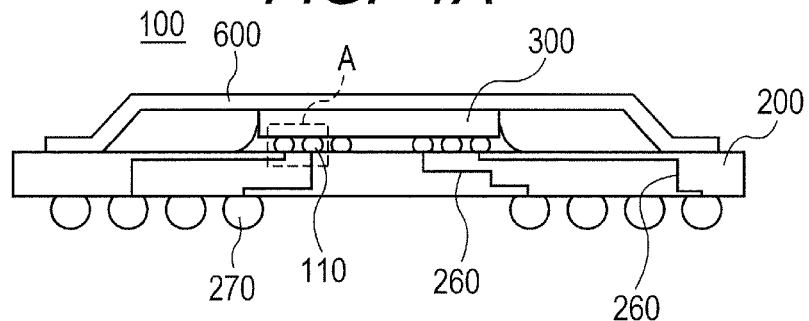
FIGS. 1A to 1C are sectional views showing a semiconductor device according to a first embodiment.

With reference to the drawings, embodiments of the present invention will be described. Also, the same reference characters are respectively attached to the same components or members in all the drawings, and their repetitive explanations will be omitted as suitably.

First Embodiment

Figure 1B:
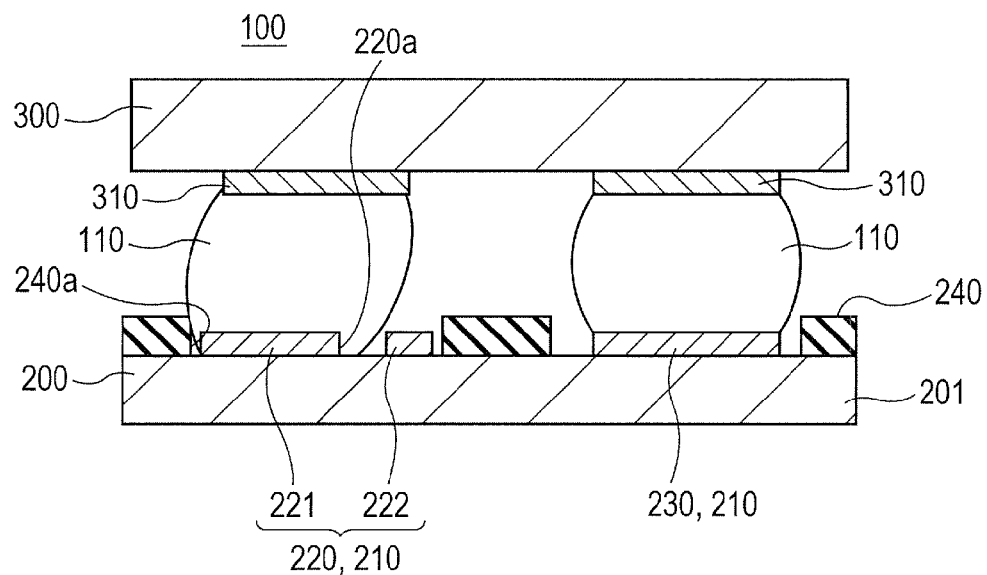
Figure 1C:
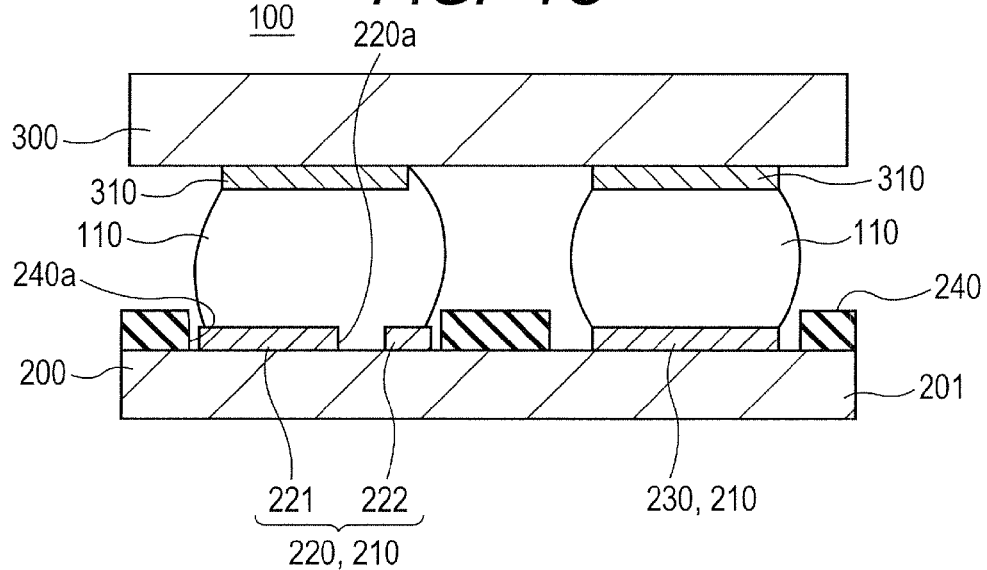
Figure 3A:
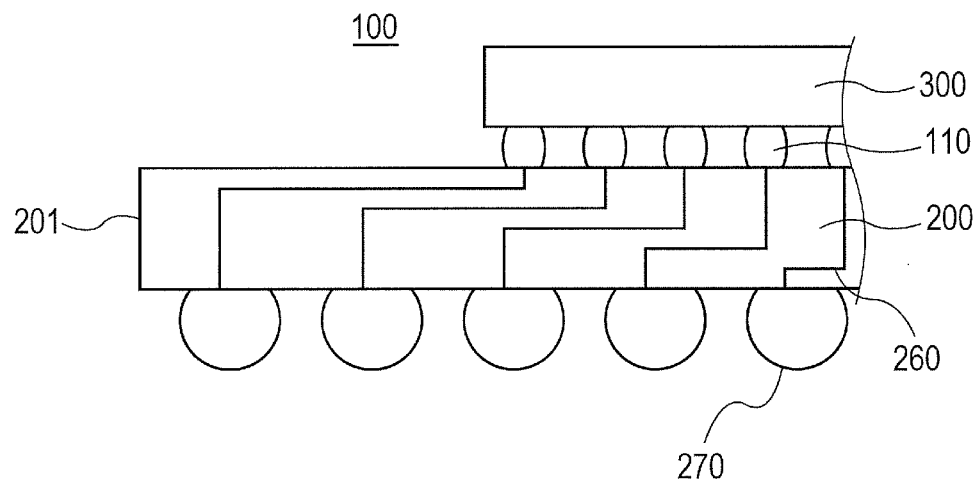
FIGS. 3A and 3B are diagrams showing the semiconductor device according to the first embodiment.
Figure 3B:
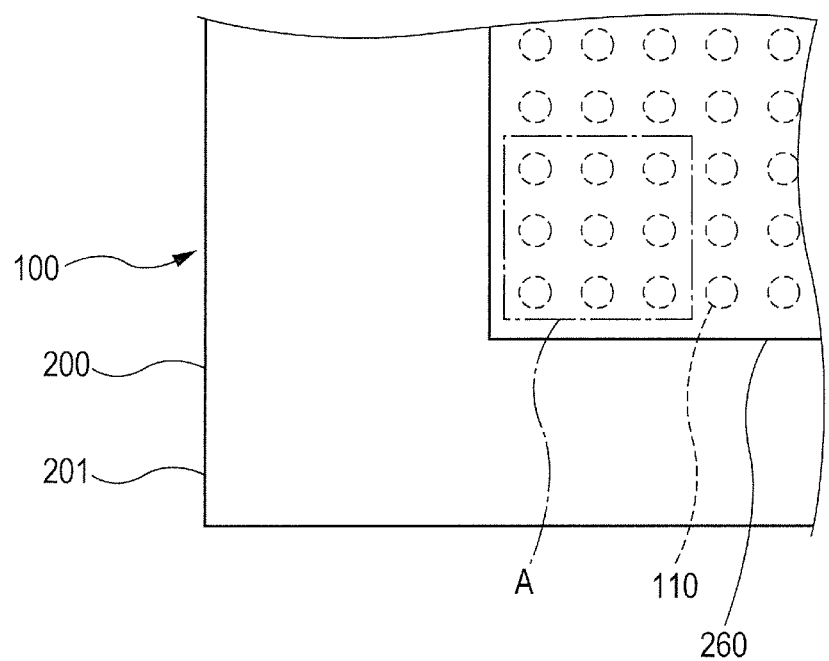

FIG. 1A is a schematic sectional view of a semiconductor device 100 according to a first embodiment, and FIGS. 1B and 1C are enlarged schematic sectional views of a region A surrounded by a broken line in FIG. 1A. FIG. 1B shows an example in which a divided portion 221 of a specific electrode 220 is coupled with a second electrode 310 of a semiconductor chip 300 (hereafter, called a "chip 300"). Further, FIG. 1C shows an example in which the divided portions 221 and 222 of the specific electrode 220 are coupled with the second electrode 310 of the chip 300. FIG. 2 is a plan view showing the specific electrode 220 of a wiring substrate 200 of the semiconductor device 100 according to the first embodiment. FIGS. 3A and 3B are schematic diagrams of the semiconductor device 100. Of the diagrams, FIG. 3A is a side sectional view and FIG. 3B is a plan view showing part of the semiconductor devices 100.

An electronic device (for example, the semiconductor device 100) according to the present embodiment includes: a wiring substrate 200 having two or more first electrodes 210 over one surface thereof; and an electronic component (for example, the chip 300) having, over one surface thereof, two or more second electrodes 310 arranged corresponding to the two or more first electrodes 210, respectively. At least one of the first electrodes 210 is a specific electrode 220 divided into two or more divided portions (for example, two divided portions 221 and 222). The divided portions 221 and 222 are coupled to different wirings 251 and 252, respectively. Further, at least one of the divided portions 221 and 222 is coupled to the corresponding second electrode 310 through a solder 110. The semiconductor device 100 according to the present embodiment is, for example, a semiconductor package. Also, the wiring substrate 200 according to the present embodiment includes: a substrate body 201; and two or more first electrodes 210 formed over one surface of the substrate body 201. At least one of the first electrodes 210 is a specific electrode 220 divided into two or more divided portions (for example, two divided portions 221 and 222). The divided portions 221 and 222 are coupled to different wirings 251 and 252, respectively. At least one of the remaining first electrodes 210 is a regular electrode 230 which is not divided into two or more portions but the whole of it is formed integrally. Further, a diameter of the regular electrode 230 is greater than a spacing between the divided portions 221 and 222. A detailed explanation thereof will be given below.

As shown in FIGS. 1A to 10 and FIGS. 3A to 3B, the semiconductor device 100 has the wiring substrate 200 and the chip 300. Over one surface of the wiring substrate 200, there are regularly arranged the two or more first electrodes 210 (for example, in matrix form). (see FIGS. 4A and 4B) Over one surface of the chip 300, the two or more second electrodes 310 are so arranged as to be opposed to the first electrodes 210, respectively. Each of the first electrodes 210 of the wiring substrate 200 is coupled with each of the second electrodes 310 of the chip 300 through the solders 110. That is, the chip 300 is flip-chip bonded over the wiring substrate 200.

As shown in FIG. 1A, a wiring 260 is laid inside the wiring substrate 200. An electrode (not shown) is formed over the other surface of the wiring substrate 200, and solder balls 270 are provided over (in FIG. 1A, under) these electrodes. The solder balls 270 are provided for coupling electrodes over the other surface of the wiring substrate 200 with electrodes (not shown) of other electronic components, such as a mother board. The wiring 260 allows part of wirings 250 and the solder balls 270 to be coupled with each other. The chip 300 may have, over an upper surface thereof or in its periphery, a protection member (lid) 600 of a metal which contains Cu or Al.

Figure 4A:
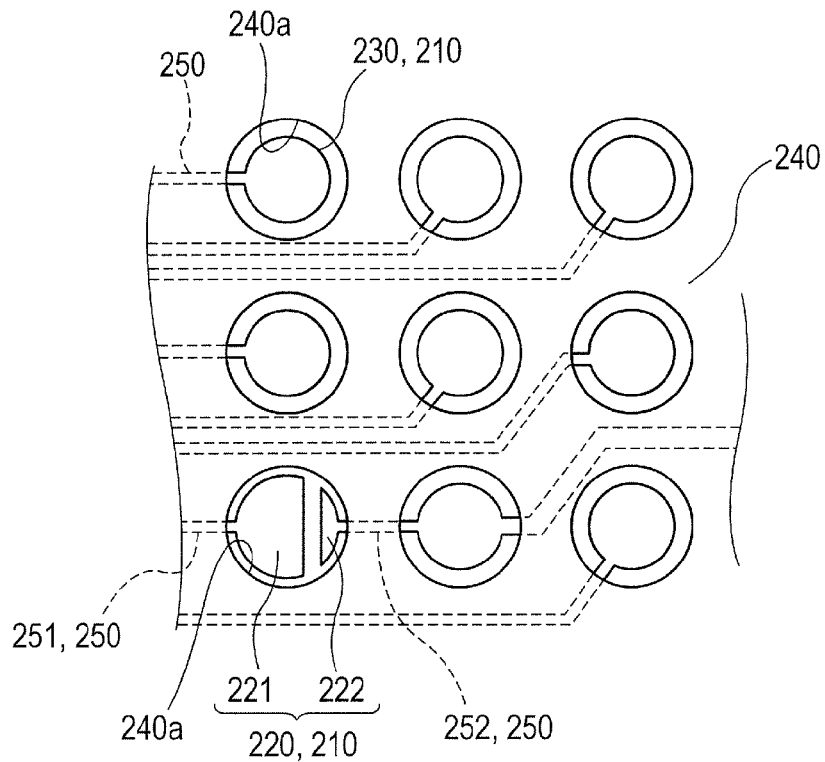
FIGS. 4A and 4B are plan views showing a part of the wiring substrate of the semiconductor device according the first embodiment.
Figure 4B:
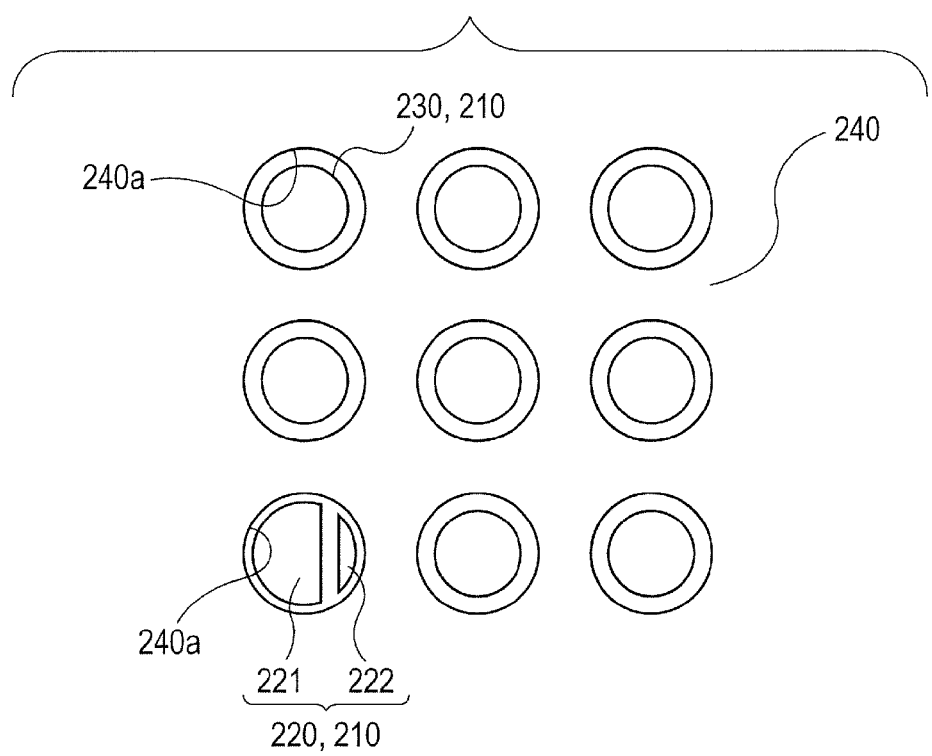

FIGS. 4A and 4B are plan views showing part (a portion inside the region A of FIG. 2B) of the wiring substrate 200. Of the diagrams, FIG. 4A shows the wirings 250 coupled to the respective first electrodes 210 (a specific electrode 220 and a regular electrode 230). However, for easy viewing of a shape of the first electrode 210, the wiring 250 is not shown in FIG. 4B.

As shown in FIGS. 4A and 4B, a solder resist 240 is formed over one surface of the wiring substrate 200. The solder resist 240 is formed by part of the solder resist 240 being removed, and has two or more openings 240a opened towards the chip side of the wiring substrate 200 at predetermined intervals. The first electrodes 210 are arranged in the corresponding openings 240a, respectively.

The two or more first electrodes 210 include the specific electrode 220 and the regular electrode 230. The regular electrode 230 is not divided into two or more portions, and the whole of it is formed integrally. The specific electrode 220 is divided into two or more divided portions (for example, two divided portions 221 and 222). The two or more divided portions 221 and 222 of the specific electrode 220 are arranged in the same opening 240a. A diameter of the regular electrode 230 is greater than a spacing (namely, a width of a slit 220a to be described later) between the divided portions 221 and 222.

Moreover, in the present embodiment, the two or more openings 240a are in circular shapes having the same radiuses. The wiring board 200 of the semiconductor device 100 of the present embodiment includes; a first opening 240a which has the specific electrode 220 therein; and a second opening 240a which has, therein, the regular electrode 230 coupled to the specific electrode 220 through the wiring 250 and adjoins the first opening 240a. The divided portions 221 and 222 are both line symmetrical to a straight line passing through a center of the first opening 240a and a center of the second opening 240a. Also, the wiring substrate 200 has further a third opening 240a adjacent to the second opening 240a. An opening center of the third opening 240a is arranged on a straight line which passes through the centers of the first opening 240a and the second opening 240a. A distance between the center of the first opening 240a and the center of the second opening 240a is equal to a distance between the center of the second opening 240a and the center of the third opening 240a. Moreover, a direction in which a wiring 251 extends with the divided portion 221 as a starting point and a direction in which a wiring 252 extends with the divided portion 222 as a starting point are opposed to each other.

As shown in FIG. 4A, the first electrodes 210 are coupled to the wirings 250, respectively. These wirings 250 include the wiring (signal line) 251 to which a predetermined signal is delivered, and the wiring (ground line) 252 coupled to a ground terminal (not shown).

In this regard, the divided portions 221 and 222 of the specific electrode 220 are coupled to different wirings 250, respectively. According to the present embodiment, for example, the divided portion 221 is coupled to the signal line 251 and the divided portion 222 is coupled to the ground line 252.

As shown in FIG. 2, the two or more divided portions 221 and 222 of the specific electrodes 220 include: the divided portion 221 which is a large-size portion whose size is relatively large; and the divided portion 222 which is a small-size portion whose size is relatively small. Of the two portions, the divided portion 221 being the large-size portion is arranged in the center of the specific electrode 220. That is, the divided portion 221 is arranged in a central part of the opening 240a corresponding to the specific electrode 220 including the divided portion 221. According to the present embodiment, for example, shapes of the divided portions 221 and 222 are acquired through dividing one circle by the linear slit 220a orthogonal to a direction in which the divided portions 221 and 222 are arranged.

In this regard, a plane area of the divided portion 221 which is a large-size portion is, for example, 75% or more of that of the regular electrode 230 and 150% or less of that of the regular electrode 230.

Figure 5A:
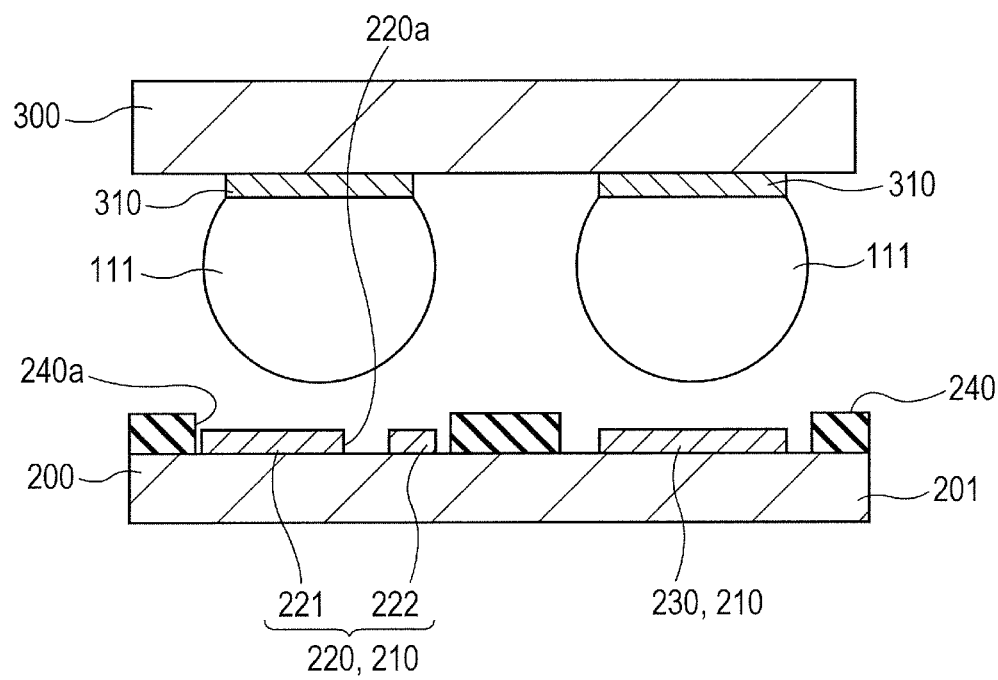
FIGS. 5A and 5B are diagrams showing a positional relation and a dimensional relation of a second electrode of a semiconductor chip and a first electrode of a wiring substrate of the semiconductor device according to the first embodiment.
Figure 5B:
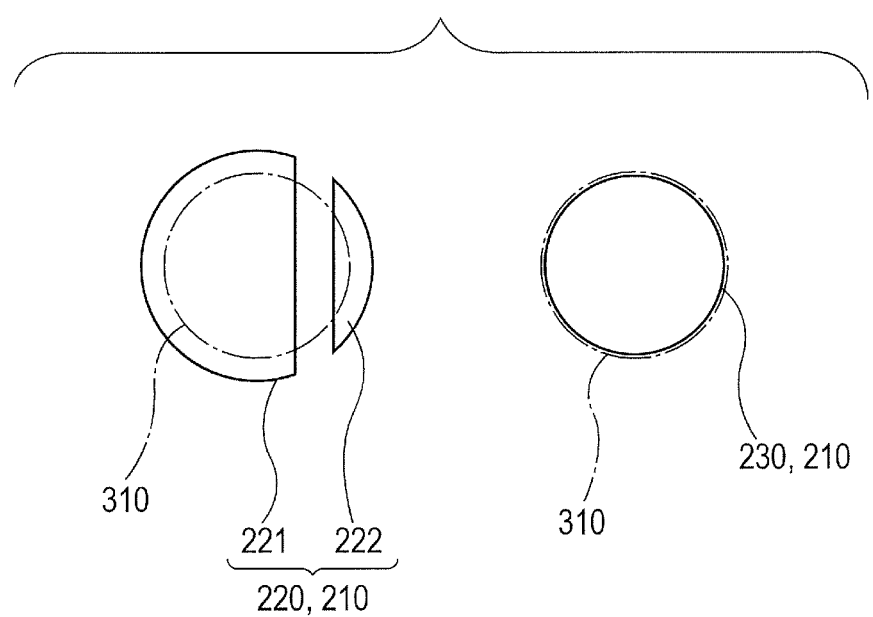

FIGS. 5A and 5B show a positional relationship and a dimensional relationship between the second electrode 310 of the semiconductor chip 300 (hereafter, called the "chip 300") of the semiconductor device 100 and the specific electrode 220 as well as the regular electrode 230 of the wiring substrate 200. Of the diagrams, FIG. 5A is a side sectional view of a state in which the wiring substrate 200 and the chip 300 are opposed so that the center of each regular electrode 230 and the center of the second electrode 310 corresponding to the regular electrode 230 may be opposed. FIG. 5B is a plan view in which the specific electrode 220 and the regular electrode 230 of the wiring substrate 200 are shown by solid lines, the second electrode 310 of the chip 300 is shown by alternate long and short dashed lines, and they are shown in an overlapped manner.

As shown in FIG. 5A, in a state where the wiring substrate 200 and the chip 300 are opposed, as shown in FIG. 5A and FIG. 5B, dimensions and the arrangement of the divided portions 221 and 222 are set so that each of the divided portions 221 and 222 of the specific electrode 220 is opposed to the corresponding second electrode 310.

In addition, as shown in FIGS. 1A to 1C, even when the chip 300 is coupled over the wiring substrate 200, each of the divided portions 221 and 222 of the specific electrode 220 is opposed to the corresponding second electrode 310. That is, when the second electrode 310 is projected over the wiring substrate 200, at least a part of each of the divided portions 221 and 222 exists in the projected area. However, it is preferred that the part of the divided portion 222 which is a small-size portion is located outside the projected area.

Figure 6:
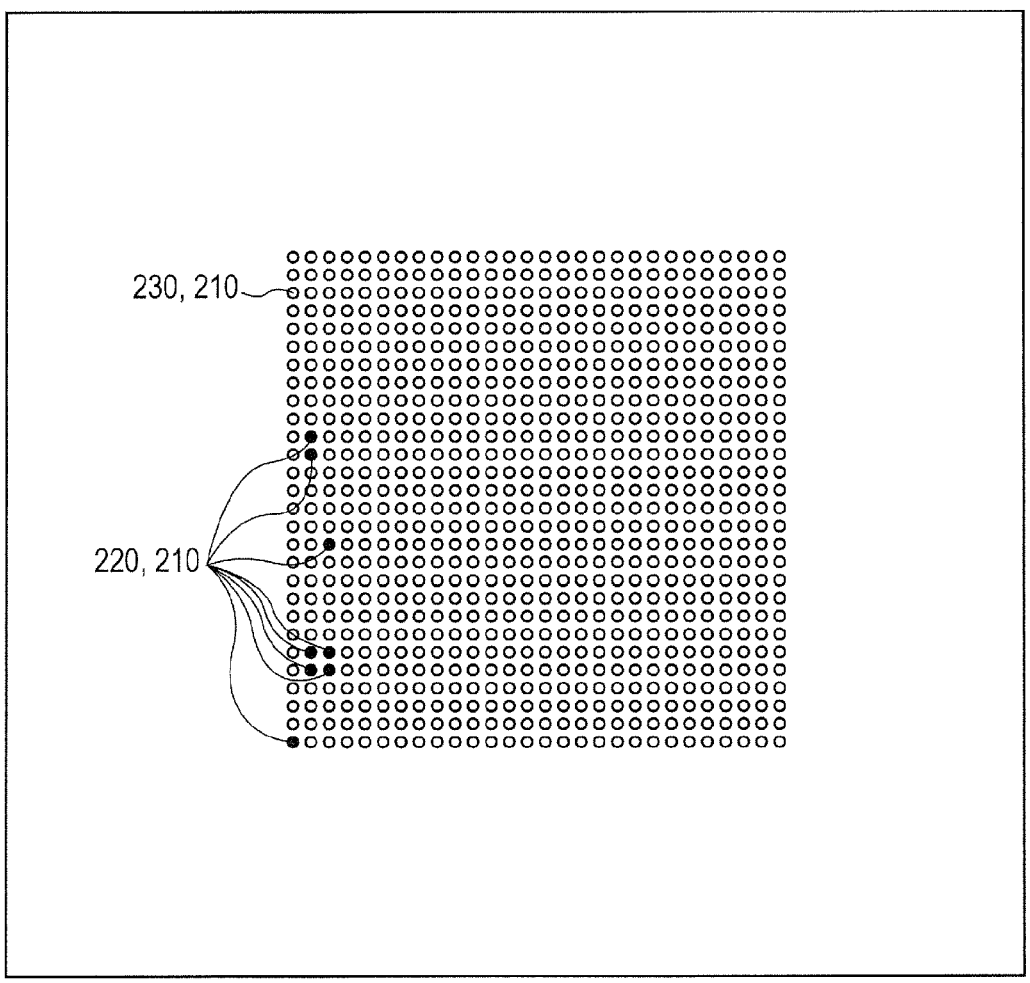
FIG. 6 is a plan view showing an example of planar arrangement of the first electrode of the wiring substrate of the semiconductor device according the first embodiment.

FIG. 6 is a plan view showing an example of a planar arrangement of the first electrodes 210 (the specific electrode 220 and the regular electrode 230) of the wiring substrate 200.

As shown in FIG. 6, over the wiring substrate 200, for example, a large number of first electrodes 210 are formed. It is preferred that the first electrodes 210 within ten rows from the outermost circumference alone include the specific electrodes 220. Moreover, of these first electrodes 210, it is preferable that at most 10% (for example, 5% or less) of the first electrodes 210 alone include the specific electrode 220.

Figure 7:
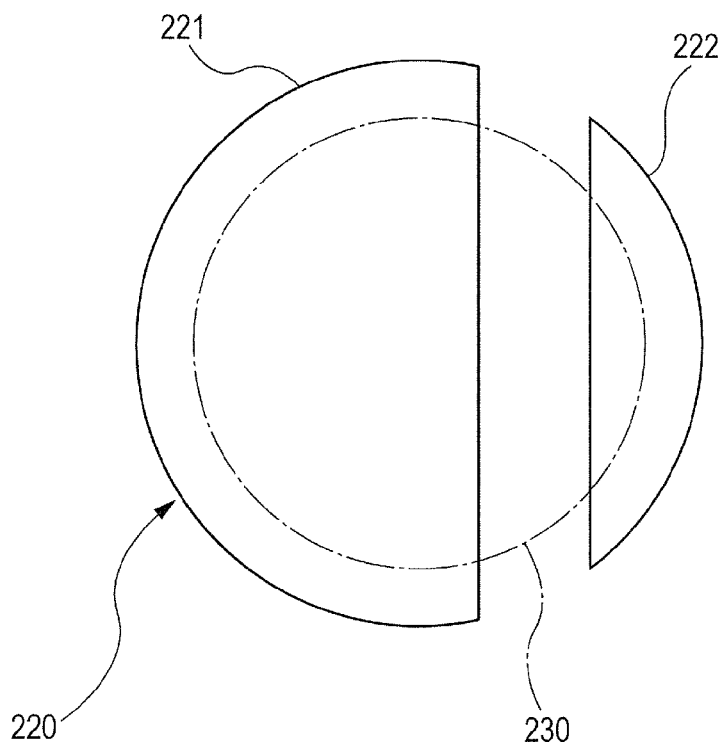
FIG. 7 is a diagram showing a dimensional relation between the specific electrode and a regular electrode of the wiring substrate of the semiconductor device according to the first embodiment.

FIG. 7 is a plan view showing a dimensional relationship between the specific electrode 220 and the regular electrode 230 over the wiring substrate 200. As shown in FIG. 7, when the center of the specific electrode 220 and the center of the regular electrode 230 are matched, at least one portion of each of the divided portions 221 and 222 is overlapped with the regular electrode 230.

Figure 8:
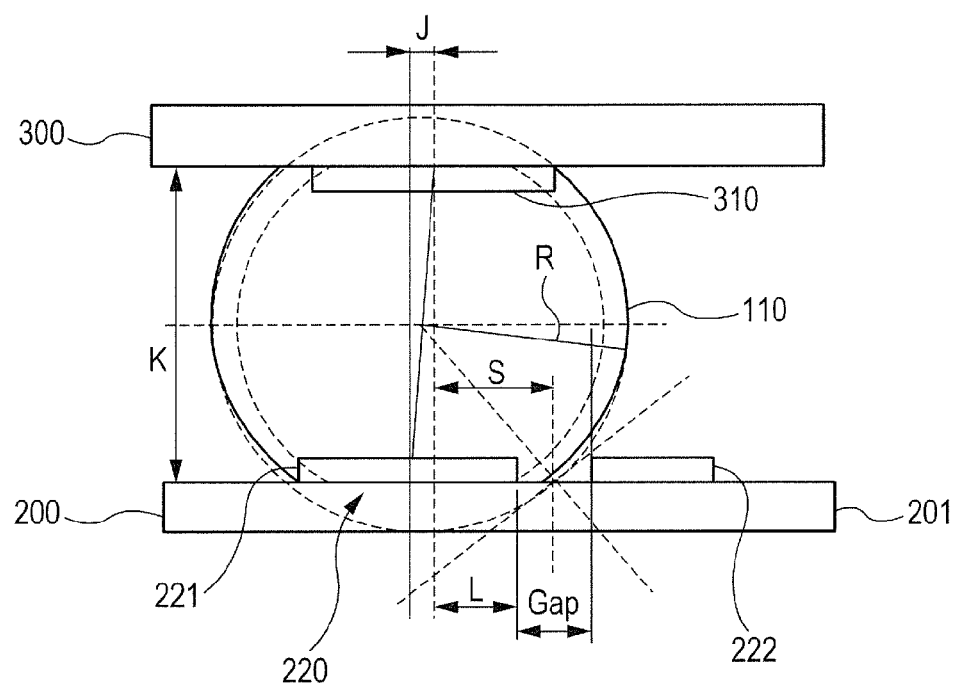
FIG. 8 is a sectional view for explaining an example of dimensional regulation of the semiconductor device according the first embodiment.

FIG. 8 is a sectional view for explaining an example of the dimensional relationship of the specific electrode 220, the solder 110, the second electrode 310, etc. of the semiconductor device 100.

The divided portions 221 and 222 of the specific electrode 220 are arranged adjacent to each other with a spacing (MIN Gap) or more specified by the following formula. Thus, when trying to selectively bond the solder 110 to the divided portion 221, the solder 110 is kept from coming into contact with the divided portion 222.

$$\text{MIN Gap} = S + (K \cdot M/2S) - (L + J/2)$$

In this regard, S in the formula is expressed by the following formula.

$S = (R^2 - (K/2)2)^{1/2}$ Also, J, R, K, L, and M in the formula represent values as follows, respectively.

J: Amount of planar shift between the central position of the second electrode 310 and the central position of the divided portion 221 R: Radius of the solder 110 K: Height of the solder L: Horizontal distance between a central position of the second electrode 310 and an end portion of the divided portion 221 on the side of the divided portion 222 M: Thickness of the divided portion 222.

Figure 9A:
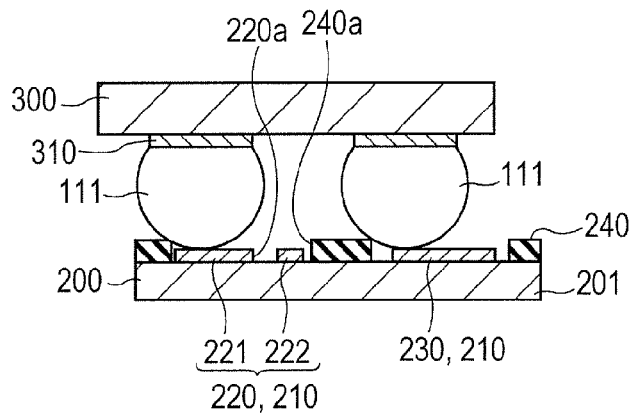
FIGS. 9A to 9D are diagrams for explaining an example of a method for manufacturing a semiconductor device according to the first embodiment.
Figure 9D:
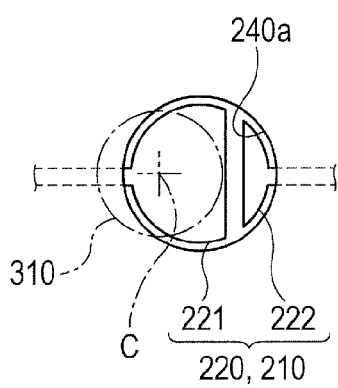
Figure 9B:
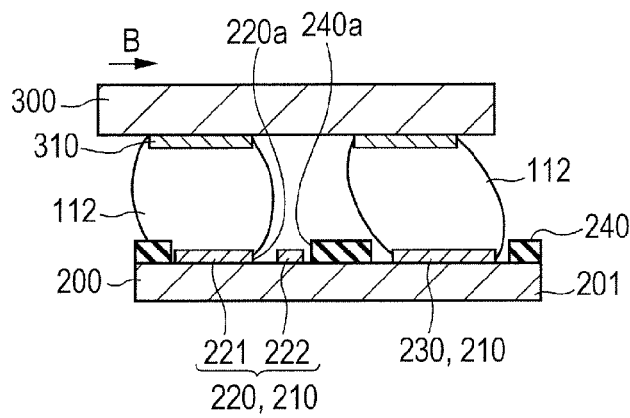
Figure 9C:
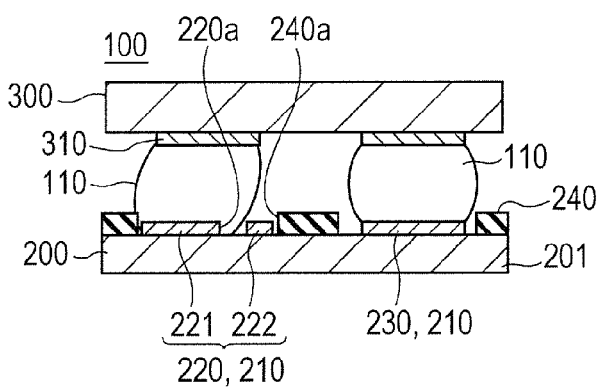
Figure 10A:
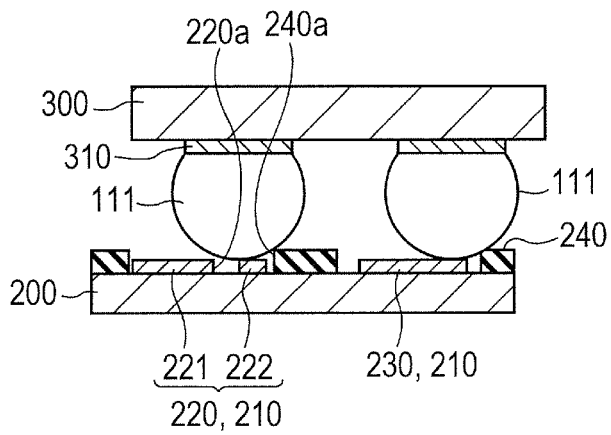
FIGS. 10A to 10D are diagrams for explaining another example of the method for manufacturing the semiconductor device according the first embodiment.
Figure 10D:
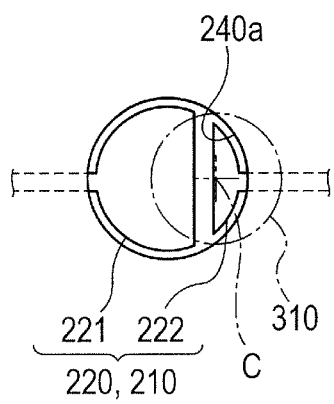
Figure 10B:
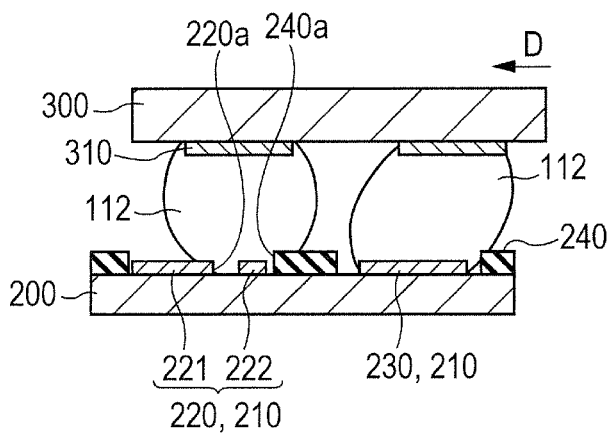
Figure 10C:
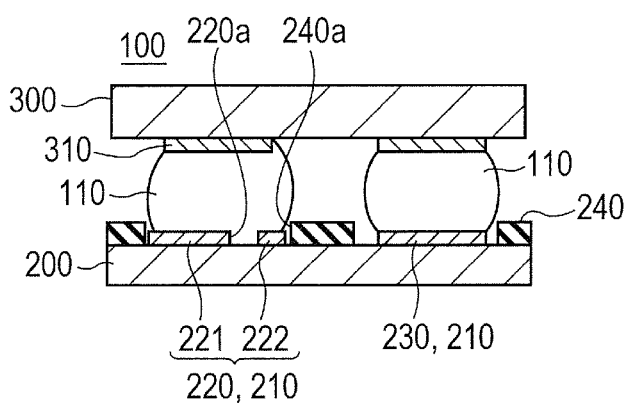

A method for manufacturing a semiconductor device of the present embodiment will be explained. FIGS. 9A to 9D illustrate an example of the manufacturing method. Of the diagrams, FIGS. 9A to 9C are sectional views showing a series of processes, and FIG. 9D illustrates a planar spatial relationship between the second electrode 310 and the specific electrode 220 at the stage shown in FIG. 9A. Similarly, FIGS. 10A to 10D illustrate another example of the manufacturing method. Of the diagrams, FIGS. 10A to 10C are sectional views showing a series of processes, and FIG. 10D shows a planar spatial relationship between the second electrode 310 and the specific electrode 220 at the stage of FIG. 10A.

This manufacturing method includes the steps of: mounting the above-described chip 300 (electronic component) over the above-described wiring substrate 200; and reflowing the solder ball 111 and coupling each of the second electrodes 310 with the first electrode 210 through the solder 110. In the above coupling step, at least one of the divided portions 221 and 222 is coupled with the corresponding second electrode 310 through the solder 110. This manufacturing method is realized by, for example, a so-called C4 (Controlled Collapse Chip Connection) method. It will be explained in detail below.

First, with reference to FIGS. 9A to 9D, there is given an explanation of an example for flip-chip bonding the chip 300 over the wiring substrate 200 such that, of the divided portions 221 and 222 of the specific electrode 220, the divided portion 221 alone is coupled with the second electrode 310.

The solder ball 111 is fixed in advance over (in FIG. 9A, under the second electrodes 310) each of the second electrodes 310 of the chip 300. In addition, dimensions of the solder balls 111 are equivalent to each other. Then, flux (not shown) is adhered to a top portion (in FIG. 9A, a lower portion) of each solder ball 111.

Next, as shown in FIGS. 9A and 9B, a center c (FIG. 9D) of each second electrode 310 is offset from the center of each of the first electrodes 210 and the chip 300 is mounted over the wiring substrate 200. In this regard, a direction of the offset is a direction in which the two or more divided portions 221 and 222 of the specific electrode 220 are arranged and, at the same time, a direction from the divided portion 222 toward the divided portion 221. Accordingly, as shown in FIG. 9A, the solder ball 111 over the specific electrode 220 is arranged over the divided portion 221 and is not arranged over the division portion 222, for example. In addition, the solder ball 111 is also arranged over the regular electrode 230. However, the solder ball 111 is arranged in an offset manner from the center of the regular electrode 230 toward the above-described direction (left-hand side of FIG. 9A).

Next, as shown in FIG. 9B, the solder ball 111 is heated to reflow. FIG. 9 B shows a state immediately after the solder ball 111 is melted. In this state, the chip 300 is floating over melted solders 112. In addition, the flux volatilizes gradually from this heated stage.

After the state shown in FIG. 9B, the chip 300 moves relatively to the wiring substrate 200 with the surface tension of each melted solder 112. Specifically, toward a direction (a direction of an arrow B of FIG. 9B) where a total value of horizontal components of the surface tension approaches zero, the chip 300 moves relatively to the wiring substrate 200. In other words, the chip 300 moves relatively with respect to the wiring substrate 200 in the opposite direction of the direction of offset described above.

As a result, as shown in FIG. 9C, the center of each regular electrode 230 is well balanced with the center of corresponding second electrode 310 at a position where they are opposed, stabilizing the relative positions of the chip 300 and the wiring substrate 200. Then, at the position, the melted solder 112 solidifies, and the chip 300 is coupled with the wiring substrate 200 through the solidified solder 110.

In this regard, as described above, with the surface tension of the melted solder 112, an operation in which the position of the chip 300 to the wiring substrate 200 is automatically corrected is called self alignment. The reason why such self alignment occurs is as follows. That is, as described above, only a few (for example, several percent or less) of a number of first electrodes 210 are the specific electrodes 220. On the other hand, the remaining large numbers of the first electrodes 210 are regular electrodes 230, and the surface tension of the solder 112 melted over these regular electrodes 230 become dominant during the self alignment of the chip 300 to the wiring substrate 200.

Because of such self alignment, the solder 110 (112) over the specific electrode 220 is extended, as shown in FIG. 9C, in an inclined direction of the normal to the chip 300 and the wiring substrate 200. In this regard, at the stage of FIG. 9A, the solder balls 111 become wet and spread in only a portion to which the flux is adhered (FIG. 9B). That is, the solder balls 111 over the specific electrode 220 become wet and spread over the divided portion 221 alone of the division portions 221 and 222. Then, while the solder balls 111 being coupled with the wet and spread portion, self alignment is carried out (FIG. 9C). Moreover, even if the melted solder 112 comes into contact with the other divided portion 222, the solders 110 are not bonded to the divided portion 222. For this reason, the solders 110 are selectively bonded to the divided portions 221 and are not conducted with the divided portions 222.

Next, with reference to FIGS. 10A to 10D, there is explained an example where the chip is flip-chip bonded over the wiring substrate 200 such that both the divided portions 221 and 222 of the specific electrode 220 are coupled with the second electrode 310.

In this case also, first, flux (not shown) is adhered to a top portion (in FIG. 10A, a lower portion) of the solder ball 111 fixed over each second electrode 310 of the chip 300.

Next, as shown in FIGS. 10A and 10B, a center c (FIG. 10D of each second electrode 310 is offset from a center of each first electrode 210, and the chip 300 is mounted over the wiring substrate 200. In this regard, a direction of the offset is a direction in which the two or more divided portions 221 and 222 of the specific electrode 220 are arranged and, at the same time, a direction from the divided portion 221 toward the divided portion 222. As a result, for example, as shown in FIG. 10A, the solder ball 111 over the specific electrode 220 is arranged over the divided portion 222, and the solder ball 111 is not arranged over the divided portion 221. In addition, the solder ball 111 is also arranged over the regular electrode 230. However, the solder ball 111 is arranged, being offset from the center of the regular electrode 230 toward the above direction (right-hand side of FIG. 10A). As shown in FIG. 10A, the amount of offset may be an offset amount such that the solder ball 111 comes into contact with the divided portion 222 alone of the specific electrode 220. Alternatively, it may be an offset amount such that the solder ball 111 comes into contact with both the division portions 221 and 222 of the specific electrode.

Next, as shown in FIG. 10B, the solder balls 111 are heated to reflow. FIG. 10B shows a state immediately after the solder balls 111 are melted. In this state, the chip 300 is floating over the melted solders 112.

After the state shown in FIG. 10B, by the surface tension of each melted solder 112, the chip 300 is self aligned with respect to the wiring substrate 200 in an opposite direction (a direction of an arrow D in FIG. 10B) to the direction of the case in FIG. 9.

As a result, as shown in FIG. 10O, the center of each regular electrode 230 is well balanced with the center of the corresponding second electrode 310 at a position where they are opposed, stabilizing the relative positional relationship between the chip 300 and the wiring substrate 200. Then, at the position, the melted solder 112 solidifies, and the chip 300 is coupled with the wiring substrate 200 through the solidified solder 110.

In this regard, at the stage shown in FIG. 10A, the solder ball 111 tends to get wet and spread in the only portion to which the flux is adhered. However, since the electrode area of the divided portion 222 is smaller than that of the division portion 221, the solder ball 111 comes into contact also with the divided portion 221 before all of the flux volatilizes. As a result, during the self alignment, the solder ball 111 gets wet and spreads also over the divided portion 221 located in the center of the specific electrode 220. For this reason, the solder 110 is bonded to both the divided portions 221 and 222.

Further, according to the method shown in FIG. 9, by selectively bonding the solder 110 to the divided portion 221, signals supplied from the second electrode 310 to which the chip 300 corresponds can be supplied to desired sections. On the other hand, according to the method shown in FIG. 10, by bonding the solder 110 to the divided portion 221 and the divided portion 222, signals supplied from the second electrode 310 to which the chip 300 corresponds are transmitted to the ground through the divided portion 222, achieving a state where the signals are not used.

Figure 11A:
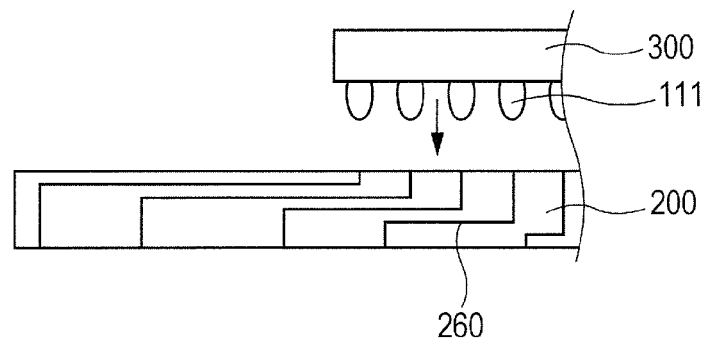
FIGS. 11A to 11C are diagrams for explaining how to reflow a solder in the method for manufacturing the semiconductor device according the first embodiment.
Figure 11B:
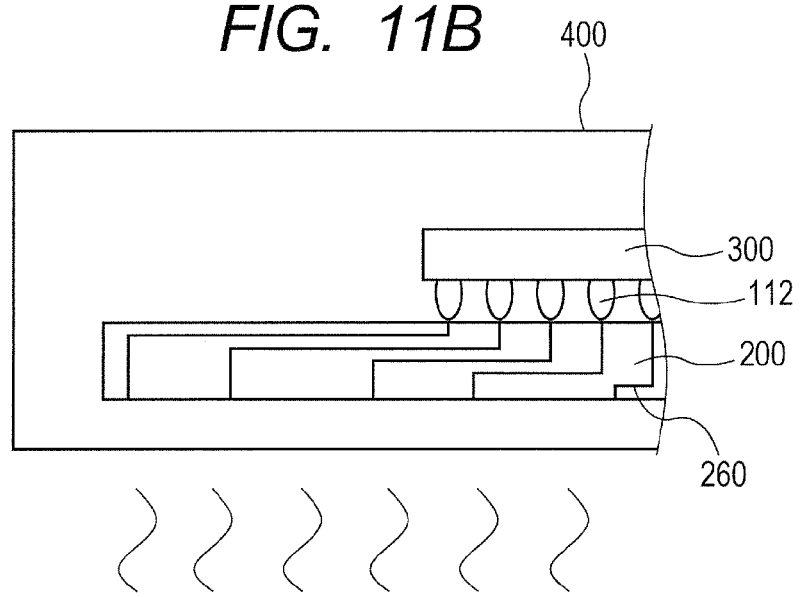
Figure 11C:
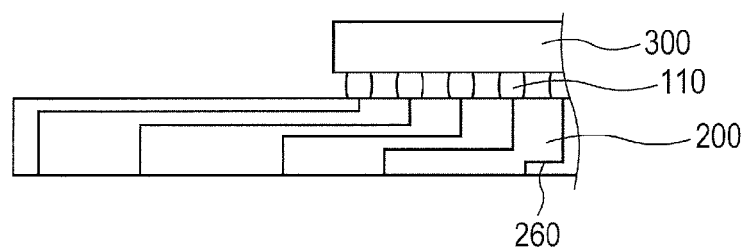

FIGS. 11A to 11C illustrate how to reflow the solder in the method for manufacturing the semiconductor device according the first embodiment.

First, the chip 300 over which the solder ball 111 is formed in advance is mounted over the wiring substrate 200 (FIG. 11A). This state corresponds to the state of FIG. 9A or the state of FIG. 10A.

Next, the wiring substrate 200 and the chip 300 are put in a reflow device 400 and heated (FIG. 11B). As a result, the solder ball 111 is melted and the above-described self alignment is performed. This state corresponds to the state of FIG. 9B or 10B.

Next, the wiring substrate 200 and the chip 300 are taken out of the reflow device 400 and cooled. Thus, a melted solder 112 is solidified, the chip 300 and the wiring substrate 200 are allowed to be coupled with each other through the solders 110. Thus, the semiconductor device 100 is obtained (FIG. 11C). This state corresponds to the state of FIG. 9C or FIG. 10C.

According to the first embodiment described above, sections to which the second electrode 310 is coupled can be changed by coupling at least one of the two or more divided portions 221 and 222 of the specific electrode 220 with the corresponding second electrode 310 through the solder 110.

As described above, when the solder ball 111 is melted and a relative position of the chip 300 to the wiring substrate 200 is adjusted by the self alignment, simply by changing the position at which the chip 300 is mounted over the wiring substrate 200, sections to which the second electrode 310 is coupled can be changed. That is, simply by changing the control of a mounter which automatically mounts the chip 300, the sections to which the second electrode 310 is coupled can be switched. In addition, when adjusting the relative position of the chip 300 to the wiring substrate 200 by the self alignment, the final relative spatial relationship of the chip 300 and the wiring substrate 200 is the same as that of a regular product. Therefore, the resultant shape of the semiconductor device 100 is similar to the regular product. Therefore, the influence such as warping etc. occurring in the semiconductor device 100 is similar to that of the regular product.

In the present embodiment, the specific electrode 220 is divided such that there are included a divided portion 221 which is a large-size portion whose size is relatively large and a divided portion 222 which is a small-size portion whose size is relatively small. As a result, even when choosing either of the cases where the solder 110 is bonded only to the large-size portion (divided portion 221) and where the solder 110 is bonded to both the large-size portion and the small-size portion (divided portion 222), a high bonding yield can be obtained. Hereafter, the reason will be explained specifically. When trying to selectively bond the solder ball 111 to one divided portion alone of the specific electrode 220, if an area of the divided portion to be bonded is extremely small as compared to that of the regular electrode 230, an overflow solder off the specific electrode 200 to be bonded may come into contact with the other divided portion inside the same specific electrode 200 and may be unintentionally bonded to both the divided portions. On the other hand, by dividing the specific electrode 220 into the large-size portion and the small-size portion whose surface areas are different from each other, the solder 110 can be bonded only to the large-size portion or can be bonded to both the large-size portion and the small-size portion. Even when it is necessary to selectively bond the solder 110 to one divided portion, by bonding the solder 110 to the divided portion 221 which is a large size portion whose size is relatively large, a predetermined solder bonding area or more can be secured.

Moreover, in the present embodiment, the specific electrode 220 has a so-called NSMD (Non-Solder Mask Defined) structure where its side surface is formed away from a solder resist 240. In the NSMD structure, solder bonding can be performed to the side surface of the electrode. Therefore, even when a sufficient area, in a plan view, of the division portion 221 cannot be secured, by allowing the side surface of the electrode to be a bonding portion, an influence of reduction in the electrode area can be eased.

Furthermore, the divided portion 221 which is the large-size portion of the specific electrode 220 may have the NSMD structure, and the divided portion 222 which is a small-size portion may have an SMD (Solder Mask Defined) structure. For example, among conductive patterns of the divided portion 222 which is the small-size portion, part of the conductive portion whose width is greater than wiring 250 is covered with the solder resist 240. By covering part of the electrode side surface with the solder resist 240, that portion serves as a region where the solder bonding is not performed. Thus, the difference in bonding area of the specific electrode 220 and the solder 110 between the case where bonding is performed to the large-size portion alone and the case where the bonding is performed to both the large-size portion and the small-size portion can be further reduced, increasing the bonding yield.

Further, both the divided portion 221 being the large-size portion of the specific electrode 220 and the divided portion 222 which is the small-size portion may have SMD structures. In the SMD structure, it is difficult to secure a solder bonding area. However, since the specific electrode 200 has the divided portions which have different areas with each other, a predetermined solder bonding area or more can be secured by allowing the solder 110 to be bonded only to the large-size portion or to both the large-size portion and the small-size portion.

Second Embodiment

Figure 12A:
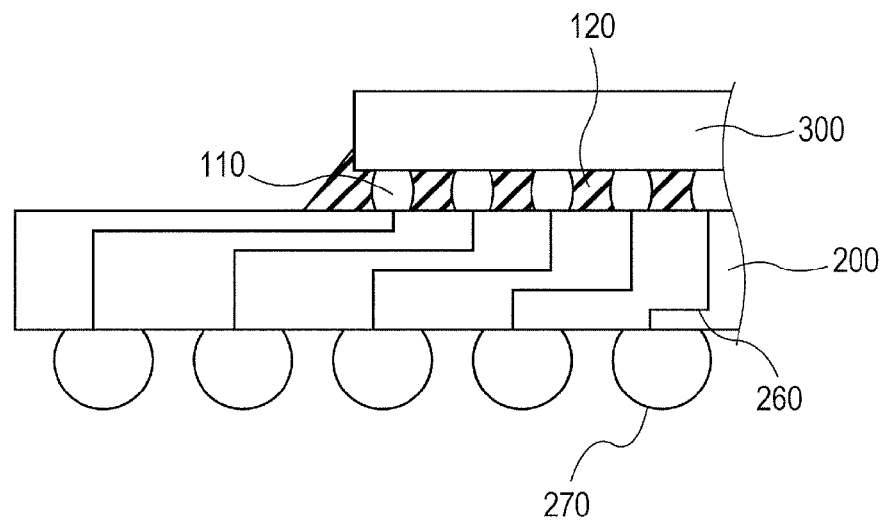
Figure 12B:
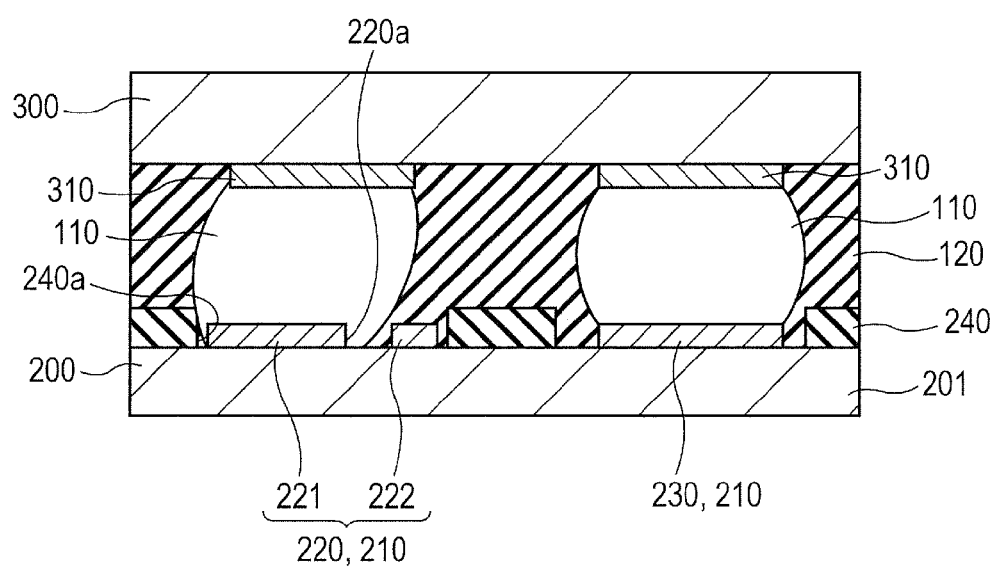

FIGS. 12A and 12B show a semiconductor device 100 according to a second embodiment. FIG. 12A is a side sectional view; and FIG. 12B is an enlarged sectional view.

The semiconductor device 100 of the present embodiment differs from the semiconductor device 100 of the first embodiment only in that an under-fill resin (resin) 120 is filled in a gap between the chip 300 and the wiring substrate 200. The rest of the feature is similar to that of the semiconductor device 100 of the first embodiment.

In this regard, in an example shown in FIG. 12B, as in FIG. 1A, the solder 110 is bonded only to the divided portion 221 of the two or more of divided portions 221 and 222 of the specific electrode 220, and the solder 110 is not bonded to the divided portion 222.

In this case, the under-fill resin 120 is also filled in a gap between the divided portion 221 and the divided portion 222. That is, of the two or more divided portions 221 and 222 of the specific electrode 220, the under-fill resin 120 is also filled in a gap between the portions which are not mutually bonded through the solder 110.

According to the second embodiment described above, the under-fill resin 120 is filled in the gap between the chip 300 and the wiring substrate 200. Therefore, with use of the under-fill resin 120, unexpected occurrence of short circuit can be suppressed. In particular, when there are portions which are not mutually coupled through the solder 110 in the two or more divided portions 221 and 222 of the specific electrode 220, the under-fill resin 120 is also filled in the gap between them, suppressing the occurrence of the short circuit thereof. The semiconductor device 100 of the present embodiment particularly exhibits efficiency when having solder balls 270. That is, when being coupled with electrodes of other electric components such as a motherboard through the solder balls 270, the semiconductor device 100 is sometimes heated to a melting point or more of the solder balls 270. However, even when the solder 110 is melted again when heated, the under-fill resin 120 can prevent the bonded state with the divided portions 221 and 222 from varying. In particular, when the solder 110 is a so-called Pb-free solder including an alloy whose principal component is pure tin (Sn) or tin (Sn) and containing at least one of silver (Ag), copper (Cu), bismuth (Bi), and zinc (Zn), a difference between the melting points of the solder 110 and the solder ball 270 becomes small. Therefore, the semiconductor device 100 of the present embodiment can receive a prominent effect.

Third Embodiment

Figure 13A:
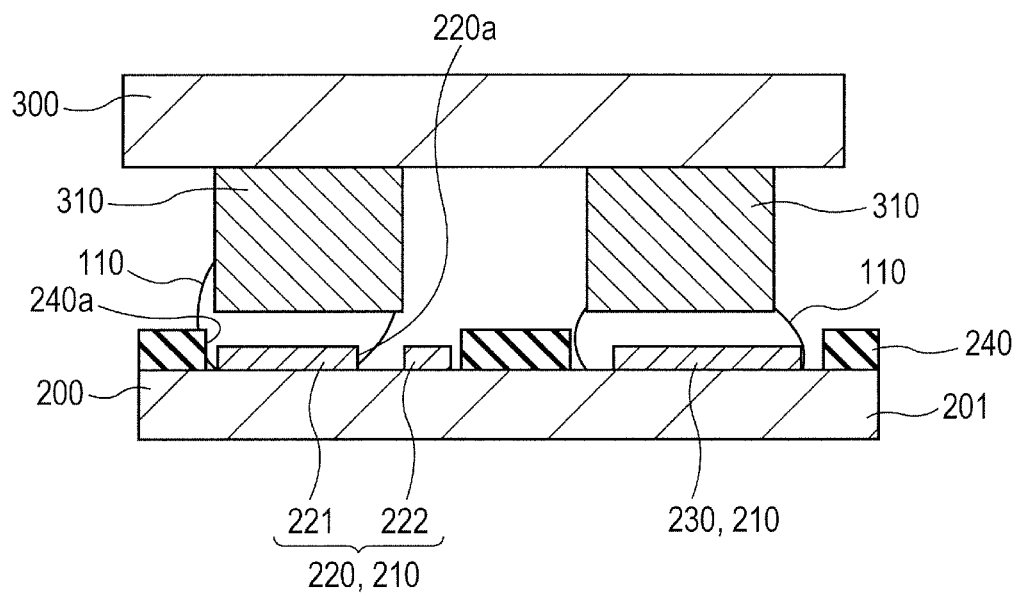
FIGS. 13A and 13B are schematic sectional views of a semiconductor device according to a third embodiment.
Figure 13B:
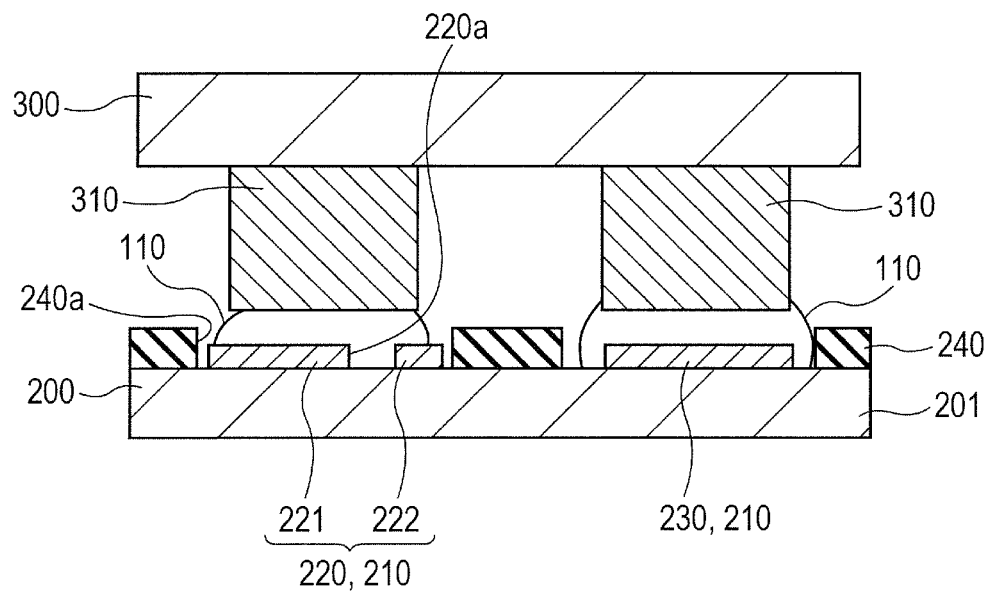
Figure 14:
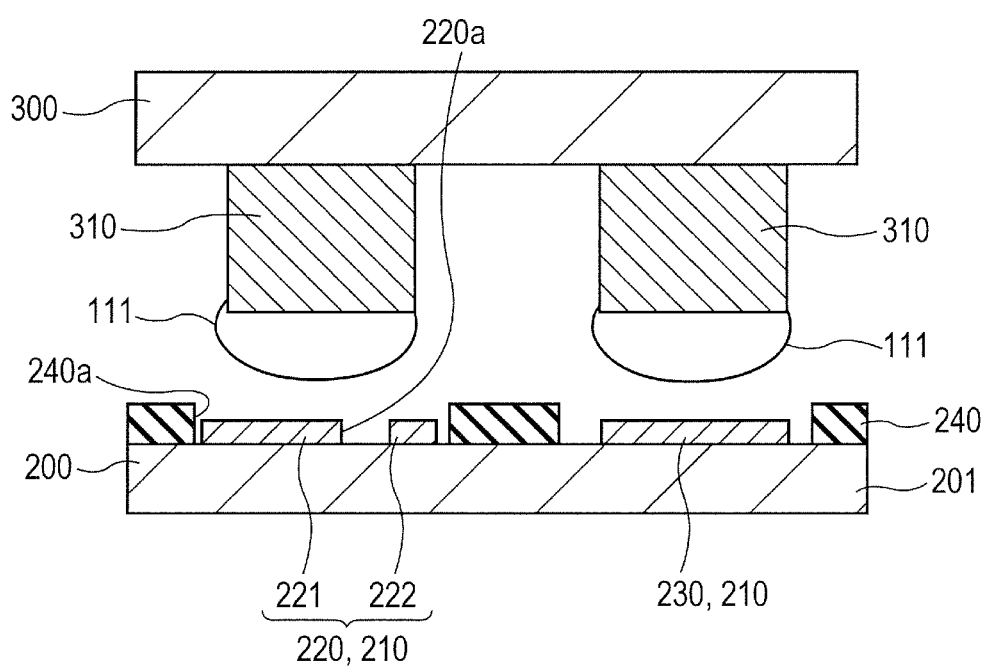
FIG. 14 is a sectional side view showing a state where there are provided, in an opposed manner, a semiconductor chip and a wiring substrate of the semiconductor device according to the third embodiment.

FIGS. 13A and 13B are schematic sectional views of the semiconductor device 100 according to a third embodiment. Of the diagrams, FIG. 13A shows an example in which the division portion 221 of the specific electrode 220 is coupled with the second electrode 310 of the chip 300; and FIG. 13B shows an example in which the divided portions 221 and 222 of the specific electrode 220 are coupled with the second electrode 310 of the chip 300. Moreover, FIG. 14 is a sectional view showing a state where the wiring substrate 200 is opposed to the chip 300 in which the solder balls 111 are formed over the second electrodes 310.

In the first embodiment described above, the explanation was given of the example in which the second electrode 310 of the chip 300 is in the pad-like shape, and the semiconductor device 100 is manufactured by the C4 method. In the third embodiment, however, an explanation will be given of an example where the second electrode 310 of the chip 300 is in the shape of a post.

As shown in FIGS. 13A and 13B, according to the present embodiment, the second electrode 310 of the chip 300 is a cylindrical-shaped conductor which contains a metal whose melting point is higher than that of the solder 110, and is a Cu post, for example. Further, as shown in FIG. 14, solder balls 111 are formed over second electrodes 310.

Figure 15A:
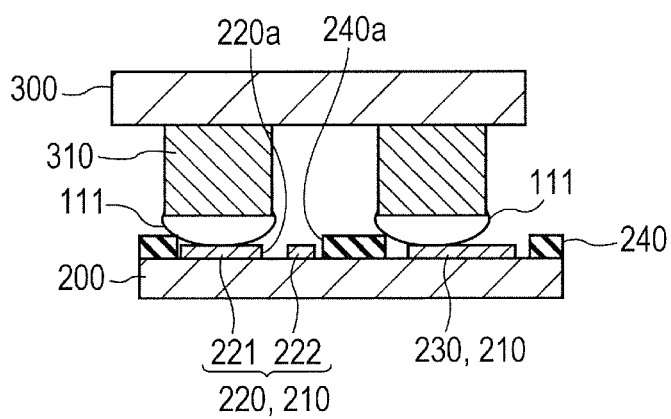
FIGS. 15A to 15D are diagrams for explaining an example of the method for manufacturing the semiconductor device according to the third embodiment.
Figure 15D:
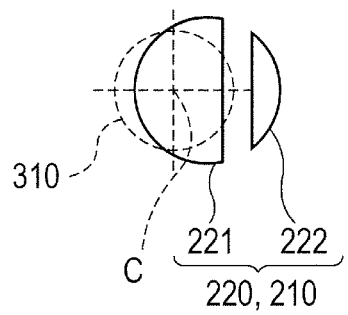
Figure 15B:
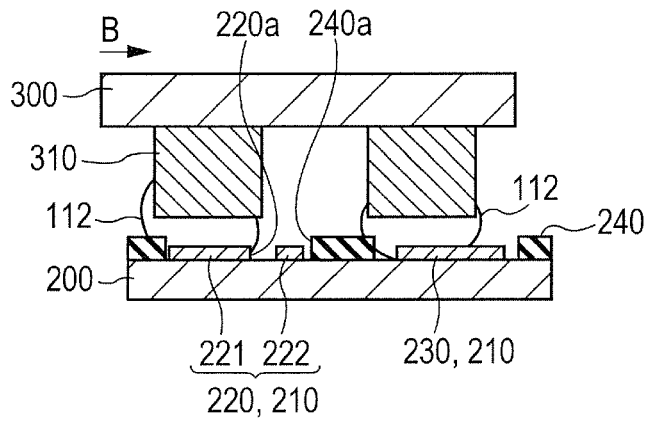
Figure 15C:
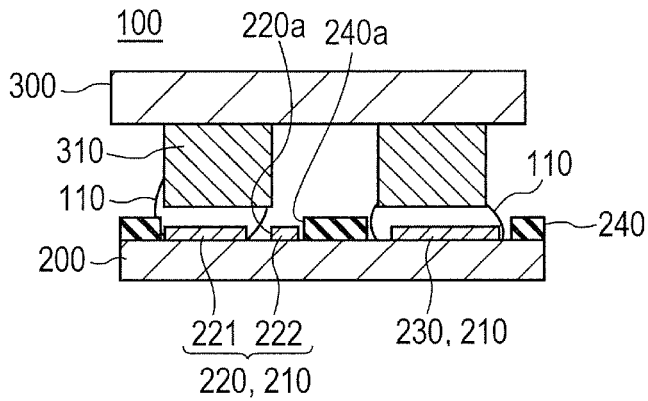
Figure 16A:
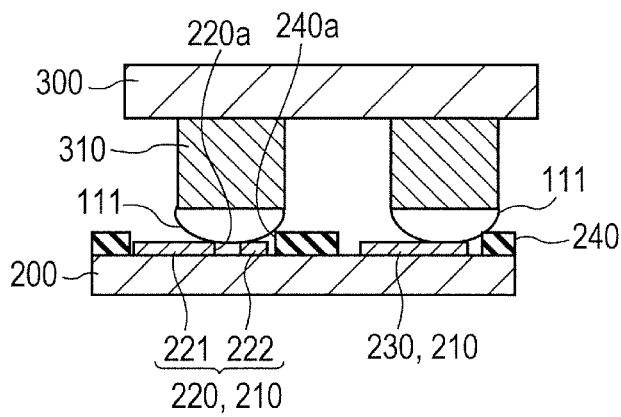
FIGS. 16A to 16D are diagrams for explaining another example of the method for manufacturing the semiconductor device according the third embodiment.
Figure 16D:
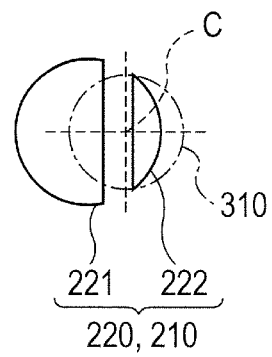
Figure 16B:
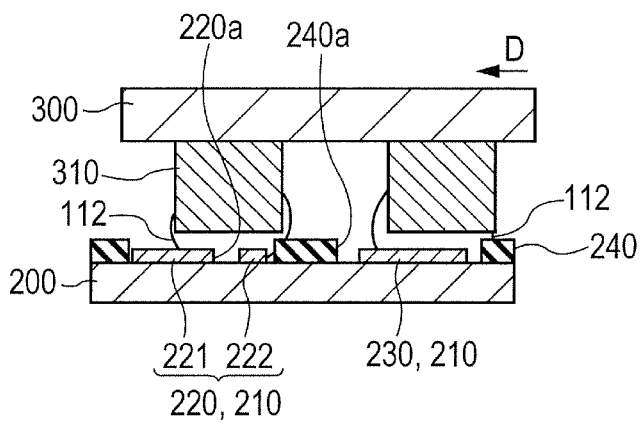
Figure 16C:
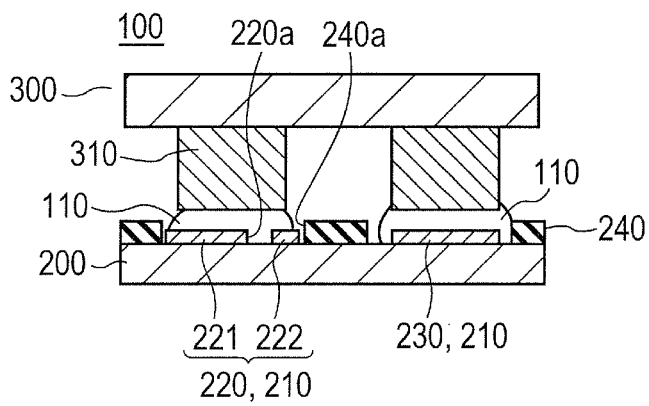

Next, a method for manufacturing a semiconductor device according to the present embodiment will be explained. FIGS. 15A to 15D illustrate an example of the manufacturing method. Of the diagrams, FIGS. 15A to 15C are sectional views showing a series of processes; and FIG. 15D shows a planar spatial relationship of the second electrode 310 and the specific electrode 220 at the stage shown in FIG. 15A. Similarly, FIGS. 16A to 16D illustrate other examples of this manufacturing method. Of the diagrams, FIGS. 16A to 16C are sectional views showing a series of processes, and FIG. 16D shows a planar positional relationship of the second electrode 310 and the specific electrode 220 at the stage shown in FIG. 16A.

First, with reference to FIGS. 15A to 15D, an explanation will be given of the example in which the chip 300 is flip-chip bonded over the wiring substrate 200 such that, of the divided portions 221 and 222 of the specific electrode 220, the divided portion 221 alone is coupled to the corresponding second electrode 310.

First, flux (not shown) is adhered to each solder ball 111.

Next, as shown in FIGS. 15A and 15D, a center c of each second electrode 310 (FIG. 15D) is offset from a center of each first electrode 210, and the chip 300 is mounted over the wiring substrate 200. The direction of the offset is the same as in the case of FIG. 9A.

Next, as shown in FIG. 15B, the solder balls 111 are heated to reflow. FIG. 15B shows a state immediately after the solder balls 111 are melted. In this state, the chip 300 is floating over the melted solders 112.

After that, as in the case in FIG. 9B, by the surface tension of the solder balls 112, self alignment is performed in a direction of the arrow B.

As a result, as shown in FIG. 15C, the center of each regular electrode 230 is well balanced with the center of the corresponding second electrode 310 at a position where they are opposed, stabilizing the relative positional relationship between the chip 300 and the wiring substrate 200. Then, at the position, the melted solder 112 solidifies, and the chip 300 is coupled with the wiring substrate 200 through the solidified solder 110.

In this regard, the solder balls 111 get wet and spread over an only portion to which the flux is adhered at the stage of FIG. 15A. That is, among the divided portions 221 and 222, the solder ball 111 over the specific electrode 222 gets wet and spreads over the divided portion 221 alone. Therefore, the solder ball 111 is selectively bonded to the divided portion 221, and is not conducted with the divided portion 222.

Next, with reference to FIGS. 16A to 16D, an explanation will be given of an example in which the chip 300 is flip-chip bonded over the wiring substrate 200 such that, of the divided portions 221 and 222 of the specific electrode 220, the divided portion 222 alone is coupled the corresponding second electrode 310.

In this case also, first, flux (not shown) is adhered to the solder ball 111 fixed over each second electrode 310 of the chip 300.

Next, as shown in FIGS. 16A and 16D, the center c of each second electrode 310 (FIG. 16D) is allowed to be offset from the center of each first electrode 210, and the chip 300 is mounted over the wiring substrate 200. The direction of the offset is the same as in the case of FIG. 10A.

Next, as shown in FIG. 16B, the solder balls 111 are heated to reflow. FIG. 16B shows a state immediately after the solder balls 111 are melted. In this state, the chip 300 is floating over the melted solders 112.

Then, as in the case of FIG. 10B, by the surface tension of the solders 112, self alignment is performed in the direction of the arrow D.

As a result, as shown in FIG. 16C, the center of each regular electrode 230 is well balanced with the center of the corresponding second electrode 310 at a position where they are opposed, stabilizing the relative positional relationship between the chip 300 and the wiring substrate 200. Then, at the position, the melted solder 112 solidifies, and the chip 300 is coupled with the wiring substrate 200 through the solidified solder 110.

In this regard, at the stage in FIG. 16A, the solder balls 111 tend to get wet and spread only over a portion to which the flux is adhered. However, in this case, during the self alignment, the solder ball 111 gets wet and spreads also over the divided portion 221 located in the center of the specific electrode 220. For this reason, the solder 110 is bonded to both the divided portions 221 and 222.

According to the third embodiment described above, the effect similar to the one in the first embodiment can be obtained. Furthermore, according to the present embodiment, the semiconductor device 100 includes a cylindrical-shaped conductor which contains a metal whose melting point is higher than that of the solder 110. Therefore, as compared to the case of not having the cylindrical conductor, variations in the position of the solder ball 111 in the direction horizontal to the substrate before the bonding reflow of the chip 300 and the wiring substrate 200 can be reduced. As a result, desired bonding to the specific electrode 220 at a high yield can be achieved. In addition, also in the third embodiment, as in the second embodiment, the under-fill resin 120 may be filled in a gap between the chip 300 and the wiring substrate 200. In particular, even in the case where the under-fill resin 120 before solidification is formed in advance before the bonding reflow of the chip 300 and the wiring substrate 200, since the solder balls 111 is supported by the cylindrical-shaped conductor, deformation of the solder ball 111 when the solder ball 111 is inserted into the under-fill resin 120 formed in advance can be reduced.

Fourth Embodiment

In the present embodiment, with reference to plan views of FIGS. 17A to 17E, variations in the shape of the specific electrode 220 will be explained.

Figure 17A:
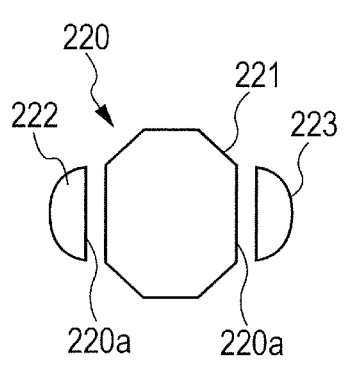
FIG. 17A to 17E are plan views for explaining variations in the shape of each specific electrode.

In the example shown in FIG. 17A, the specific electrode 220 has three divided portions 221, 222, and 223. Among these, the divided portion 221 which is a large-size portion is formed as an octagon. On both sides of the divided portion 221, divided portions 222 and 223 which are semi-circular small-size portions are arranged, respectively. Linear slits 220a are formed between the divided portion 221 and the divided portions 222 and 223, respectively. Though not shown, different wirings 250 are coupled to the divided portions 221 to 223, respectively. In this example, there are cases where the solder bump (solder 110) is bonded only to the divided portion 221, bonded only to the divided portions 221 and 222, bonded only to the divided portions 221 and 223, and bonded to all the divided portions 221, 222, and 223. In either case, the shape and arrangement of each of the divided portions 221 to 223 are set such that the shape of the bonding end of the solder 110 to the specific electrode 220 can be as round as possible.

Figure 17B:
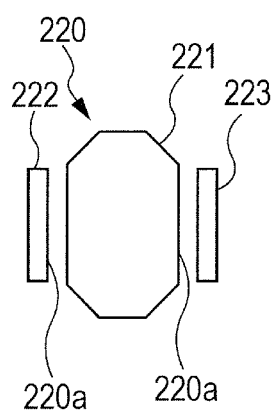

Also in the example of FIG. 17B, the specific electrode 220 has three divided portions 221, 222, and 223. The divided portion 221 which is a large-size portion is formed to be an octagon. On both sides of the divided portion 221, there are arranged the divided portions 222 and 223 which are small-size portions, respectively. However, in the example of FIG. 17B, the divided portions 222 and 223 are formed linearly (in a strip-like shape), respectively. Though not shown, different wirings 250 are coupled to the divided portions 221 to 223, respectively. The divided portions 222 and 223 are formed, for example, on an extended line of the wiring 250 (not shown) with the same width (right-and-left width of FIG. 17B) as that of the wiring 250. In this way, it becomes easier to form the divided portions 222 and 223 and the wiring 250 integrally. In addition, in the example of FIG. 17B also, variations in the bonding between the specific electrode 220 and the solder 110 is similar to those of the example of FIG. 17A.

Figure 17C:
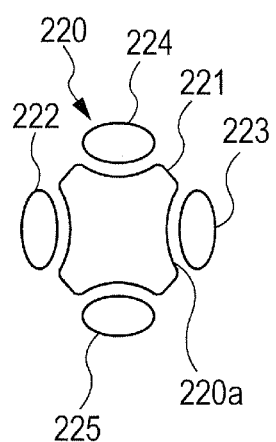

In the example of FIG. 17C, the specific electrode 220 has five divided portions 221, 222, 223, 224, and 225. The divided portions 222 to 225 which are small-size portions are formed as oval figures, respectively. The divided portions 222 to 225 are arranged in four directions of the divided portion 221 being the large-size portion at angles of 90 degrees. Between the divided portions 222 to 225 and the divided portion 221, there is formed an arc-shaped slit 220a along an arc-shaped perimeter along a long axis of each of the divided portions 222 to 225. For this reason, along a perimeter of the divided portion 221, there is formed a recess in alignment with the arc-shaped perimeter along the long axis of each of the divided portions 222 to 225. Though not shown, different wirings 250 are coupled to the respective divided portions 221 to 225. In the example of FIG. 17C, as compared to the cases of FIGS. 17A and 17C, the number of the divided portions 221 to 225 is greater, increasing the number of variations in coupling the specific electrode 220 with the solder 110.

Figure 17D:
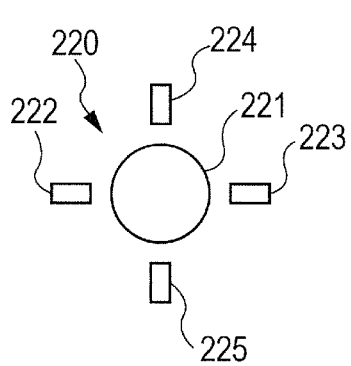

Also in the example of FIG. 17D, the specific electrode 220 has five divided portions 221, 222, 223, 224, and 225. In this example, the divided portion 221 which is a large-size portion is made to be circular. Moreover, the divided portions 222 to 225 which are small-size portions are formed in the shape of a rectangle, respectively. The divided portions 222 to 225 are arranged in four directions of the divided portion 221 at angles of 90 degrees, respectively. Though not shown, different wirings 250 are coupled to the divided portions 221 to 225, respectively. The divided portions 222 to 225 are formed on an extended line of the wiring 250 (not shown) with the same width as that of the wiring 250. In this way, it becomes easier to form the divided portions 222 to 225 and the wiring 250 integrally. The variations in coupling the specific electrode 220 with the solder 110 in the example of FIG. 17D are the same as those of the example of FIG. 17C.

Figure 17E:
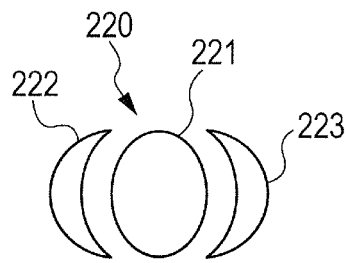

In the example of FIG. 17E, the specific electrode 220 has three divided portions 221, 222, and 223. The divided portion 221 which is a large-size portion is formed to be oval or circular. On both the sides of the divided portion 221, the divided portions 222 and 223 being crescent-like small-size portions are arranged with their chords on the side of the divided portion 221. Though not shown, different wirings 250 are coupled to the divided portions 221 to 223, respectively. The variations in coupling the specific electrode 220 with the solder 110 in the example of FIG. 17E are the same as those of the example of FIG. 17A. In either of the variations, a shape and arrangement of each of the divided portions 221 to 223 is set such that a shape of a coupling end of the solder 110 to the specific electrode 220 becomes as round as possible.

In either of the cases of FIGS. 17A to 17E, two or more small-size portions (divided portions 222 to 225) are arranged around the large-size portion (divided portion 221).

In addition, in either of the cases of FIG. 17A to FIG. 17E, the divided portions 221 to 225 being small-size portions are formed in the same shape and of the same size, for example. However, of the divided portions 221 to 225 being small-size portions, at least two of the shapes or sizes may be different from each other.

Fifth Embodiment

Figure 18A:
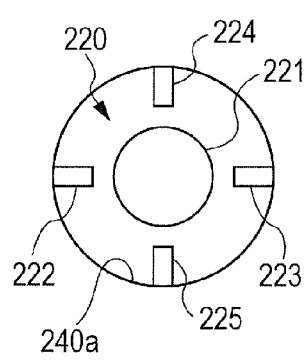
FIG. 18A to 18C are plan views for explaining a method for manufacturing a semiconductor device according to a fifth embodiment.
Figure 18B:
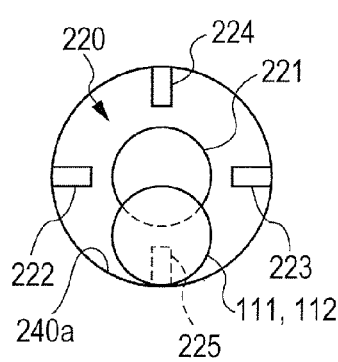
Figure 18C:
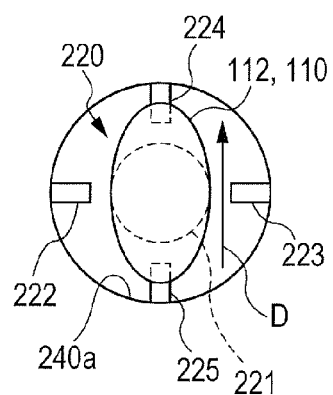
Figure 19A:
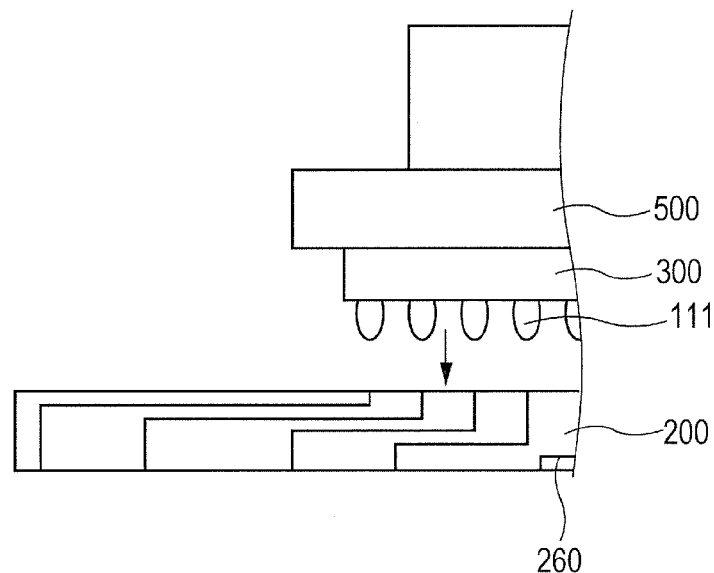
FIG. 19A to 19C are diagrams for explaining how to reflow a solder in the method for manufacturing the semiconductor device according the fifth embodiment.
Figure 19B:
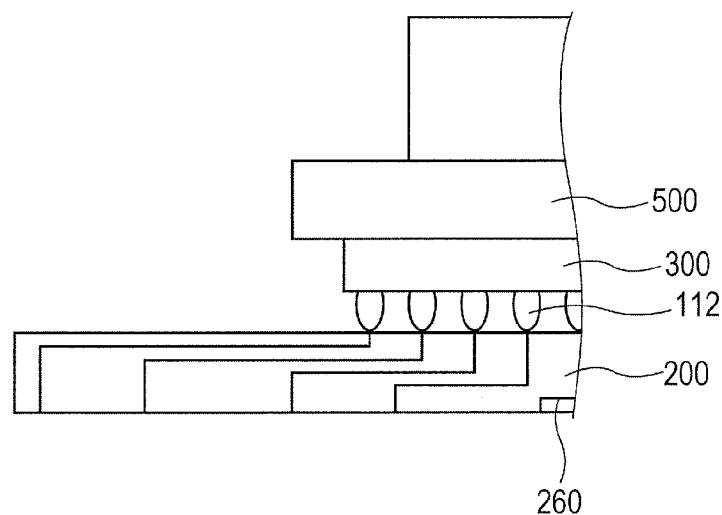
Figure 19C:
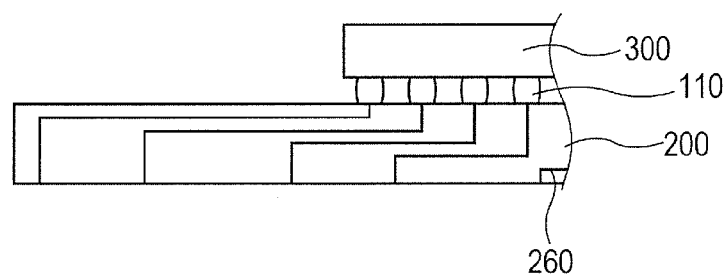

In a fifth embodiment, an explanation will be given of an example in which, with use of a local reflow device, the solder is allowed to get wet and spread over a desired divided portion of the specific electrode. FIGS. 18A to 18C are plan views to illustrate a method for manufacturing a semiconductor device according to the fifth embodiment. FIGS. 19A to 19C illustrate how to reflow solders in the manufacturing method.

According to the present embodiment, a configuration of the chip 300 is the same as in the third embodiment described above, and the second electrode 310 is a Cu post, for example (see FIG. 14). Moreover, except for the configuration of the specific electrode 220, the wiring substrate 200 is the same as that of the third embodiment. According to the present embodiment, the specific electrode 220 has a configuration as shown in FIG. 18A. This configuration is the one shown in FIG. 17D explained in the above fourth embodiment.

The method for manufacturing the semiconductor device according to the present embodiment will be described.

First, the chip 300 in which the solder ball 111 is provided in advance is adsorbed and held by an adsorption head 500 of the local reflow device (overall illustration is not shown). Then, while the chip 300 is being adsorbed and held by the adsorption head 500, the chip is mounted over the wiring substrate 200 (FIG. 19A). In this regard, as shown in FIG. 18B, the chip 300 is arranged over the wiring substrate 200 such that the solder ball 111 is located over a desired small-size portion and a large-size portion of the specific electrode 220. For example, the solder ball 111 is located over the divided portion 225 and over the divided portion 221. In this regard, a diameter of the solder ball 111 at the stage shown in FIG. 18B is substantially the same as a diameter of the second electrode 310 being a Cu post.

Next, by heating the adsorption head 500, the solder ball 111 is melted (FIG. 18B, FIG. 19B). Accordingly, first, the melted solder 112 gets wet and spreads over the divided portion 225 and the divided portion 221.

While the chip 300 being adsorbed and held by the adsorption head 500, together with the adsorption head 500, the chip 300 is moved relatively to the wiring substrate 200 in the direction of the arrow D of FIG. 18C. Accordingly, as shown in FIG. 18C, the melted solder 112 gets wet and spreads over the divided portion 225, the divided portion 221, and the divided portion 224. That is, of the two or more divided portions, over a desired divided portion, the melted solder 112 is allowed to get wet and spread.

Next, the melted solder 112 is cooled and solidified. As a result, the chip 300 and the wiring substrate 200 are coupled with each other through the solder 110. Specifically, the divided portions 221, 224, and 225 of the specific electrode 220 are coupled to the second electrode 310 through the solder 110.

According to the fifth embodiment described above, the following effects are obtained. That is, when the electrode of the chip 300 is a Cu post etc., since the amount of solder over the electrode is relatively small, the solder is less likely to get wet and spread over the electrode of the wiring substrate 200. Under this circumstance, according to the present embodiment, with the solder being melted, it becomes possible to have the solder get wet and spread over a desired divided portion by supporting the chip 300 and moving the chip 300 relatively to the wiring substrate 200. That is, for example, the solder is allowed to get wet and spread to an extent greater than a diameter of the second electrode 310 being the Cu post. Moreover, for example, in an inspection after sorting, when malfunction of the semiconductor device is found, it is possible to melt the solder 110 again and to do over the coupling in the circuit, raising the yield.

Sixth Embodiment

Figure 23:
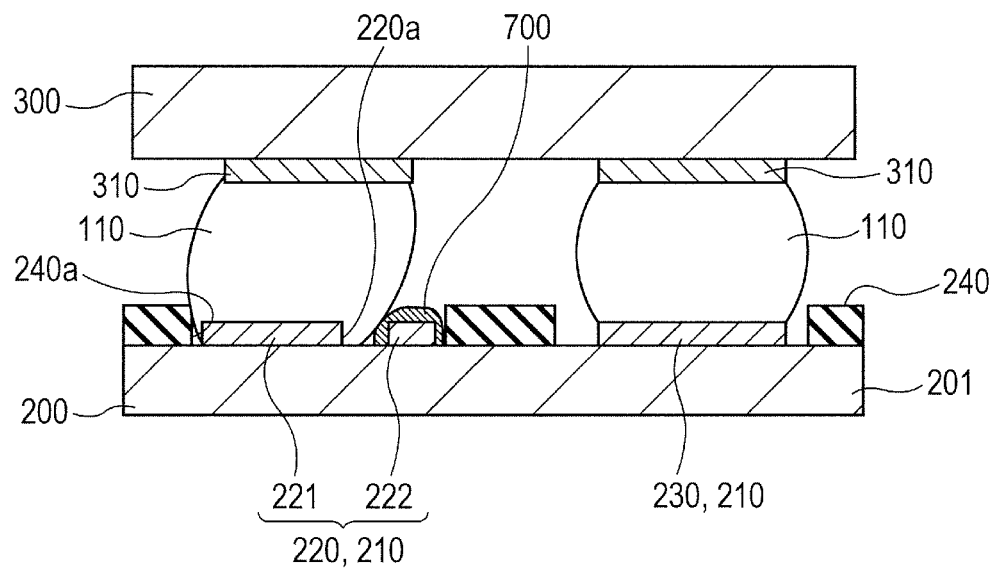
FIG. 23 is a sectional view showing a semiconductor device according to a sixth embodiment.

With reference to FIG. 23, a sixth embodiment will be described. The semiconductor device of the present embodiment differs from the semiconductor devices in other embodiments in that the divided portion 222 of the specific electrode 220 is covered with an insulating film 700 before the chip 300 is mounted. The insulating film 700 includes, for example, a thermosetting resin of an epoxy group. It is preferred that the insulating film 700 covers all of a side surface and an upper surface of the divided portion 222. It is preferred that the insulating film 700 is formed such that its thickness over the divided portion 222 is thinner than the thickness of the solder resist 240. In order to form the insulating film 700, for example, by an inkjet method, an insulating resin before being cured is printed over the wiring substrate 200 so as to cover a given divided portion 222 and is cured by heating or by a UV processing. Subsequently, by mounting the chip 300, the semiconductor device according to the present embodiment can be obtained. According to the present embodiment, since the divided portion 222 is covered with the insulating film 700, it becomes possible to reliably suppress an unexpected short circuit of the divided portion 222 of the specific electrode 220 and the solder 110. Therefore, the solder 110 can selectively be bonded to the divided portion 221 of the specific electrode 220. Moreover, it becomes possible to reduce the amount of offset at the time of mounting the chip 300, for example. Furthermore, by forming the under-fill resin 120, there is formed a double insulating film between the divided portion 222 of the specific electrode 220 and the solder 110, and positive insulation is attained even when either the insulating film 700 or the under-fill resin 120 contains a void etc.

Seventh Embodiment

Figure 24:
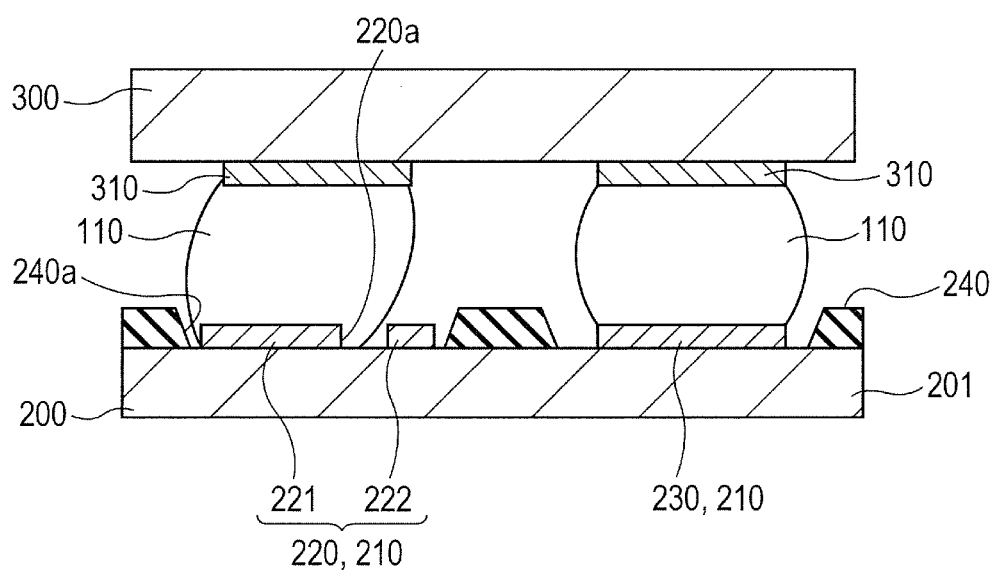
FIG. 24 is a sectional view showing a semiconductor device according to a seventh embodiment.

With reference to FIG. 24, a seventh embodiment will be explained. The present embodiment differs from other embodiments in that an opening 240a of the solder resist 240 is in a tapered shape in which a diameter of the opening 240a increases from a bottom surface (a side close to a substrate body 201) of the solder resist 240 toward an upper surface (a side close to the chip 300). It is preferred that an angle made by the bottom surface of the solder resist 240 and a sidewall (an inner circumferential wall of the opening 240a) is less than 75 degrees. Such a tapered shape of the solder resist 240 can be achieved by, for example, increasing diffraction in a process of exposure for forming an opening of the solder resist 240, increasing the amount of etching in a development process, or forming the solder resist with two layers having different opening diameters. The tapered shape of the solder resist 240 makes it possible to suppress malfunction of not arriving caused by the solder ball 111 coming over the solder resist when the offset mounting of the chip 300 is carried out. Further, a space where the melted solder 112 can spread can be made larger. Therefore, it becomes possible to prevent an unintentional short circuit between the divided portion 222 and the solder 110 while coupling the divided portion 221 of the specific electrode 220 with the solder 110. In addition, the similar effect can be obtained even when a sectional form of the first electrode 210 is made to be a trapezoid in which the diameter decreases from a bottom surface (a side close to the substrate body 201) toward an upper surface (a side close to the chip 300). That is, the space where the melted solder 112 can spread can be made larger. Therefore, it becomes possible to prevent the unintentional short circuit between the divided portion 222 and the solder 110 while coupling the divided portion 221 of the specific electrode 220 with the solder 110. By performing wet etching after patterning of the first electrode 210, the cross-section of the first electrode 210 is allowed to be in such a trapezoidal shape. The trapezoidal shape can be maintained even when forming, for example, an Ni layer or an Au plating layer over a surface of the first electrode 210 after the wet etching.

In the embodiment described above, examples where the chip 300 is flip-chip bonded over the wiring substrate 200 are shown. However, the present invention is not limited to those examples. The present invention can be similarly applied to the cases where a BGA (Ball Grid Array) package (semiconductor device) is mounted over a motherboard (wiring substrate).

Moreover, in the embodiments described above, the explanation is given of the example where the electronic component is the chip 300 and the electronic device is the semiconductor device 100. However, the electronic component may be the one other than the chip and the electronic device may be the one other than the semiconductor device.

Moreover, of the two or more first electrodes 210, at least one of the first electrodes 210 may not be coupled with the second electrode 310.

Moreover, at least one of the divided portions of the specific electrode 220 may be coupled with a power source line. Alternatively, it may be coupled with another first electrode 210.

Figure 21:
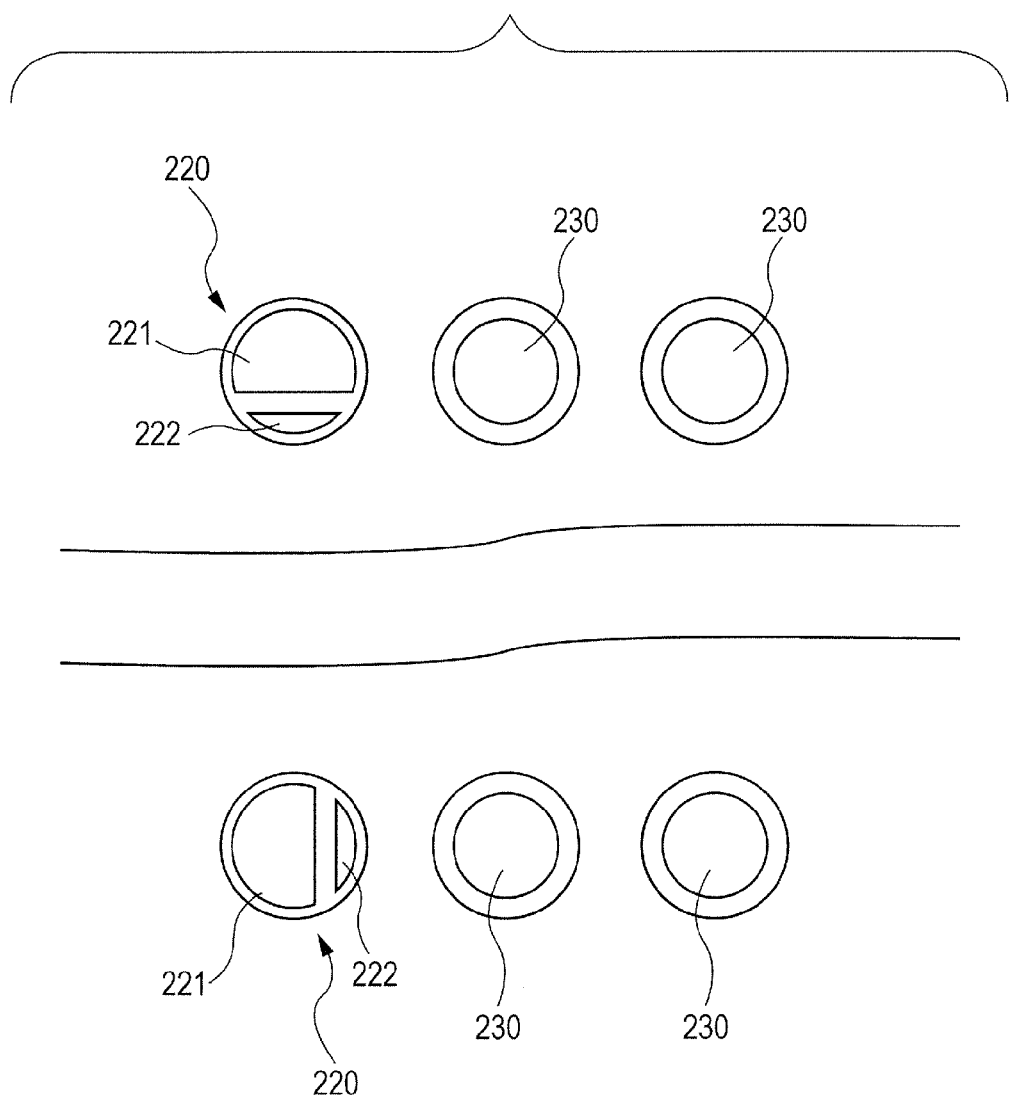
FIG. 21 is a plan view showing another example of the arrangement when the two or more specific electrodes are arranged.
Figure 22A:
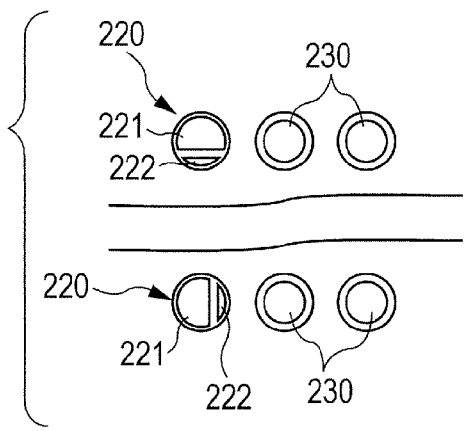
FIGS. 22A to 22D are diagrams for explaining variations in the bonding option in the case of the arrangement of FIG. 21.
Figure 22B:
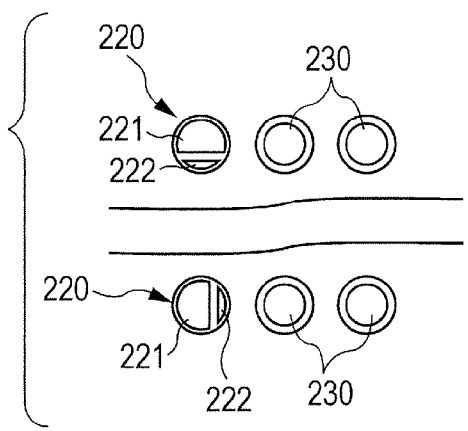
Figure 22C:
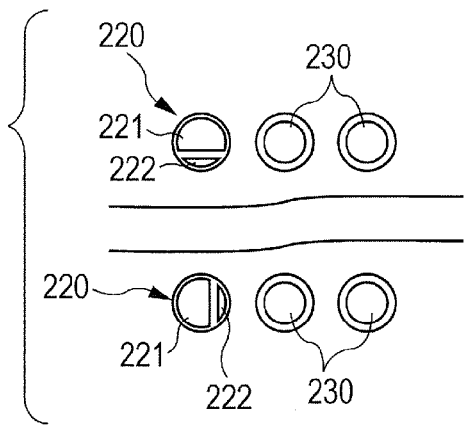
Figure 22D:
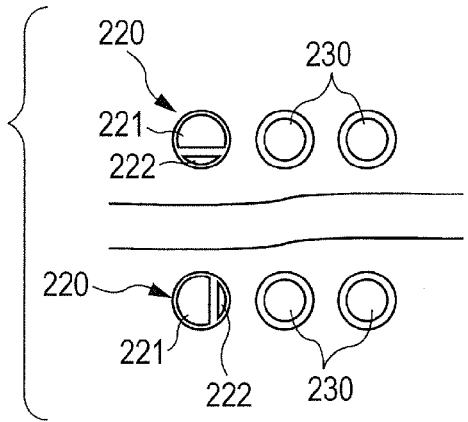

Moreover, when forming the two or more specific electrodes 220 over the wiring substrate 200, orientations of the specific electrodes 220 may be the same as shown in FIG. 20. Alternatively, as shown in FIG. 21, there may be included the specific electrodes 220 oriented differently with each other. That is, with respect to the two specific electrodes 220 shown in FIG. 20, directions in which the two or more divided portions 221 and 222 are arranged are the same with each other (horizontal direction of FIG. 20). On the other hand, of the two specific electrodes 220 shown in FIG. 21, a direction (up-and-down direction of FIG. 21) in which the two or more divided portions 221 and 222 of one specific electrode 220 (upper side) are arranged and a direction (left-and-right direction of FIG. 21) in which the two or more divided portions 221 and 222 of the other (lower side) specific electrode 220 are arranged are orthogonal to each other.

In this regard, with reference to FIGS. 22A to 22D, variations in the bonding potion, when the two or more specific electrodes 220 are arranged in a direction shown in FIG. 21, where the chip 300 is coupled over the wiring substrate 200 by self alignment, will be explained. The chip 300 is offset in a direction (lower left direction) of an arrow E shown in FIG. 22A relative to the wiring substrate 200 so that the chip 300 is mounted over the wiring substrate 200 and the self alignment described above is performed. Thus, it becomes possible to bond the solder 110 to both the divided portions 221 and 222 of the upper specific electrode 220 and to selectively bond the solder 110 to the divided portion 221 alone of the lower specific electrode 220. Also, the chip 300 is offset in a direction (lower right direction) of an arrow F shown in FIG. 22B relative to the wiring substrate 200 so that the chip 300 is mounted over the wiring substrate 200 and the self alignment described above is performed. Thus, it becomes possible to bond the solder 110 to both the divided portions 221 and 222 of the upper specific electrode 220 and to bond the solder 110 to both the divided portions 221 and 222 also of the lower specific electrode 220. Moreover, the chip 300 is offset in a direction (upper right direction) of an arrow G shown in FIG. 22C relative to the wiring substrate 200 so that the chip 300 is mounted over the wiring substrate 200 and the self alignment described above is performed. Thus, it becomes possible to selectively bond the solder 110 to the divided portion 221 alone of the upper specific electrode 220 and to bond the solder 110 to both the divided portions 221 and 220 of the upper specific electrode 220. Moreover, the chip 300 is offset in a direction (upper left direction) of an arrow H shown in FIG. 22D relative to the wiring substrate 200 so that the chip 300 is mounted over the wiring substrate 200 and the self alignment described above is performed. As a result, it becomes possible to selectively bond the solder 110 to the divided portion 221 alone of the upper specific electrode 220 and to selectively bond the solder 110 to the divided portion 211 alone also of the lower specific electrode 220. Thus, by forming the two or more specific electrodes 200 oriented differently with each other over the wiring substrate 200, the variations in the bonding option can be increased.

Figure 25A:
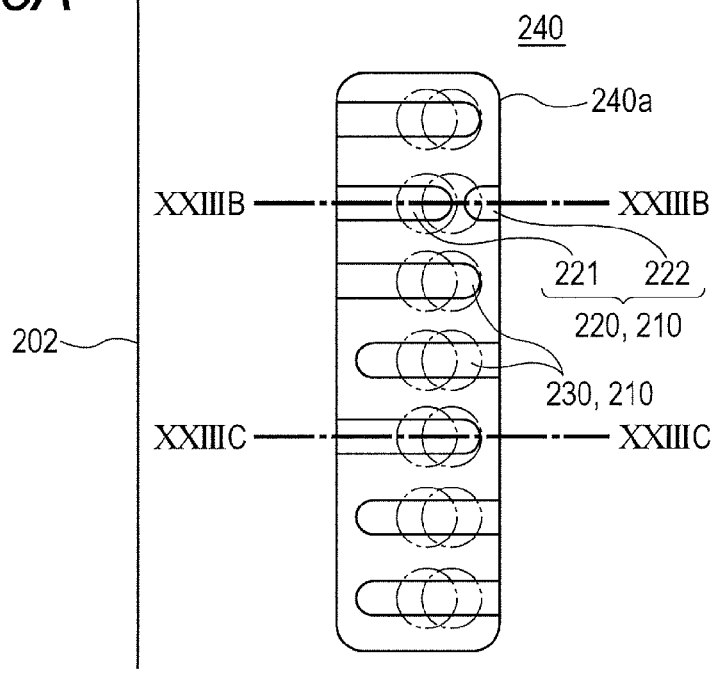
FIGS. 25A to 25C show a semiconductor device according to a modification.
Figure 25B:
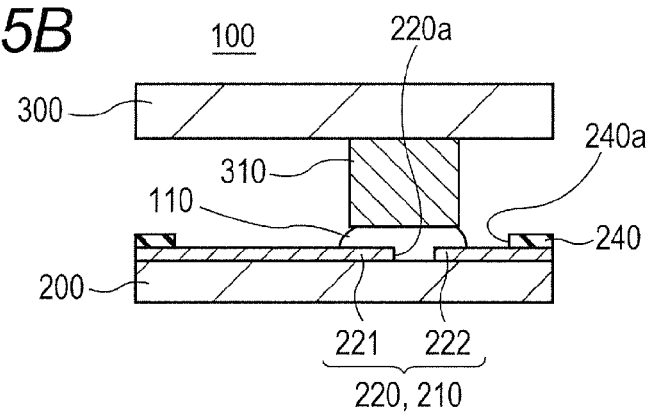
Figure 25C:
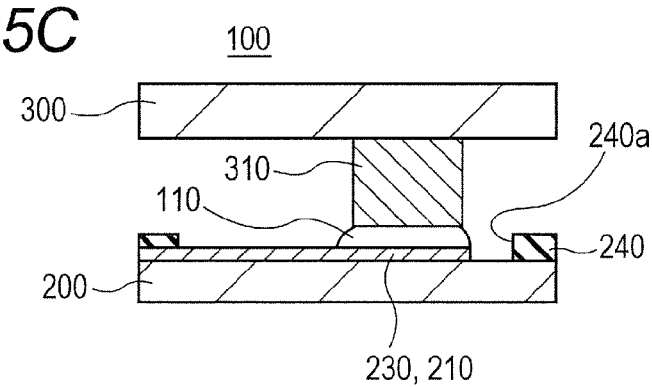

Moreover, in the embodiments described above, the explanation is given of the example where there are arranged the specific electrode 220 and the regular electrode 230 of the first electrode 210 in the different openings 240a of the solder resist 240. However, the specific electrode 220 and the regular electrode 230 may be arranged in the same opening 240a of the solder resist 240. For example, in the opening 240a extending along a first side of the wiring substrate 200, there may be formed a linear first electrode 210 which extends in a direction perpendicular to the first side of the wiring substrate 200. Explanations will be given with reference to FIGS. 25A to 25C. FIGS. 25A to 25C show a semiconductor device according to a modification. FIG. 25A is a plan view; FIG. 25B is a sectional view taken along line B-B of FIG. 25A; and FIG. 25C is a sectional view taken along line C-C of FIG. 25A. A solid line on the left in FIG. 25A shows a first side 202 of the wiring substrate 200. The wiring substrate 200 has a linear (lead-like) first electrode 210 extending in a direction perpendicular to the first side 202. The first electrode 210 includes the specific electrode 220 and the regular electrode 230. The wiring substrate 200 has the solder resist 240 over a surface thereof. The solder resist 240 has openings 240a, and has the specific electrode 220 and the regular electrode 230 in the same opening 240a. The specific electrode 220 has the divided portions 221 and 222. An area of the divided portion 221 is greater than an area of the divided portion 222 and is, for example, coupled to a signal line. The divided portion 222 is coupled, for example, to a fixed potential, such as a ground. The FIG. 25A shows, by an alternate long and short dashed line and a chain double-dashed line, a region of the solder 110 formed over a second electrode 310 of the chip 300 to be mounted over the wiring substrate 200. In addition, in FIGS. 25B and 25C, cross-sections when the solder 110 is positioned in the region indicated by the chain double-dashed line is shown. In the present modification also, it is possible to selectively bond the solder 110 to the divided portion 221 by mounting and reflowing the chip 300 so that the solder ball 111 may be positioned on the side 202 (left-hand side in the drawing) of the first side, namely, on the alternate long and short dashed line. On the other hand, by mounting and reflowing the chip 300 so that the solder ball 111 may be positioned on the right-hand side in the drawing, namely, on the chain double-dashed line in the drawing, the solder 110 can be coupled to both the divided portions 221 and 222. In the example of FIG. 25A, the two or more first electrodes 210 arranged in an upper and lower direction of FIG. 25A are arranged in the same opening 240a, and they are not partitioned from each other by the solder resist 240. For this reason, in particular, as shown in FIGS. 25B and 25C, by forming the second electrode 310 of the chip 300 in the shape of a post, it becomes possible to prevent an unexpected short circuit between adjacent first electrodes 210. That is, the second electrode 310 in the example of FIGS. 25A to 25C is, for example, a cylindrical conductor containing a metal whose melting point is higher than that of the solder 110, and is a Cu post, for example. Moreover, when the substrate 200 includes: a second opening 240a (not shown) formed along a second side 203 (not shown) adjacent to the first side 202 and is perpendicular thereto; and an electrode 210 (not shown) formed in the second opening 240a, it is preferred that a width of the electrode 210 (a length of the electrode 210 in a direction perpendicular to a direction in which the electrode 210 extends) is greater than a distance between the divided portions 221 and 222 in the first opening 240a. As a result, regardless of the offset of the chip 300 in a vertical direction with respect to the first side 202 when the chip 300 is being mounted, it becomes possible to allow the coupling state of the electrode 210 in the second opening 240a and the chip 300 to be the same. In addition, even when the second electrodes 310 of the chip 300 are arranged alternately, a similar effect can be obtained by shifting and arranging the divided portions of the specific electrode 220 in accordance with the arrangement of the second electrodes 310.

What is claimed is:
1. An electronic device comprising:
a wiring substrate having two or more first electrodes over one surface thereof;
an electronic component having, over one surface thereof, two or more second electrodes arranged corresponding to said two or more first electrodes, respectively,
wherein at least one of said first electrodes is a specific electrode divided into two or more divided portions, the two or more divided portions being separated by a gap configured to keep a solder from coming in contact with at least one of the divided portions;
wherein said divided portions are coupled to different wirings, respectively, and
wherein at least one of said divided portions is coupled to corresponding said second electrode through the solder.
2. The electronic device according to claim 1,
wherein at least one of said first electrodes is a regular electrode which is not divided into two or more divided portions but is formed integrally, and
wherein said regular electrode is coupled with corresponding said second electrode through a solder.
3. The electronic device according to claim 2,
wherein said two or more divided portions include:
a large-size portion whose size is relatively large, and
a small-size portion whose size is relatively small.
4. The electronic device according to claim 3, wherein each of said divided portions is opposed to said second electrode.
5. The electronic device according to claim 4,
wherein a solder resist is formed over said one surface of said wiring substrate;
wherein two or more openings are formed at regular intervals in said solder resist, and
wherein said first electrodes are arranged in corresponding said openings, respectively.
6. The electronic device according to claim 2, wherein a diameter of said regular electrode is greater than the gap between said divided portions.
7. The electronic device according to claim 3, wherein said large-size portion is arranged in a central part of said specific electrode.
8. The electronic device according to claim 7, wherein two or more said small-size portions are arranged around said large-size portion.
9. The electronic device according to claim 8, wherein a gap between said electronic component and said wiring substrate is filled with a resin.
10. The electronic device according to claim 9, wherein said electronic component is a semiconductor chip.
11. The electronic device according to claim 9, wherein said electronic component is a semiconductor package.
12. A wiring substrate, comprising:
a substrate body;
two or more first electrodes formed over one surface of said substrate body,
wherein at least one of said first electrodes is a specific electrode divided into two or more divided portions, the two or more divided portions being separated by a gap configured to keep a solder from coming in contact with at least one of the divided portions;
wherein said divided portions are coupled to different wirings, respectively;
wherein at least one of remaining said first electrodes is a regular electrode which is not divided into two or more portions but the whole of it is formed integrally, and
wherein a diameter of said regular electrode is greater than a spacing between said divided portions.
13. The wiring substrate according to claim 12, wherein, when the wiring substrate is opposed to an electronic component in which two or more second electrodes are arranged at regular intervals, said regular electrodes are opposed to corresponding said second electrodes, respectively, and said divided portions of said specific electrode are opposed to corresponding said second electrodes.

14. The wiring substrate according to claim 13 being designed for flip-chip bonding.

15. A method for manufacturing an electronic device, comprising the steps of:
mounting, over a wiring substrate having two or more first electrodes over one surface thereof, an electronic component having, over one surface thereof, two or more second electrodes provided corresponding to said two or more first electrodes, at least one of said first electrodes being a specific electrode which is divided into two or more divided portions, the two or more divided portions being separated by a gap configured to keep a solder from coming in contact with at least one of the divided portions, said divided portions being coupled to different wirings, respectively, and solder balls being formed over said second electrodes, respectively; and
reflowing said solder ball and coupling each of said second electrodes with said first electrode through the solder,
wherein, in said coupling step, at least one of said divided portions is coupled with corresponding said second electrode through the solder.

16. A method for manufacturing an electronic device, comprising the steps of:
mounting, over a wiring substrate having two or more first electrodes over one surface thereof, an electronic component having, over one surface thereof, two or more second electrodes provided corresponding to said two or more first electrodes, at least one of said first electrodes being a specific electrode which is divided into two or more divided portions, said divided portions being coupled to different wirings, respectively, and solder balls being formed over said second electrodes, respectively; and
reflowing said solder ball and coupling each of said second electrodes with said first electrode through the solder,
wherein, in said coupling step, at least one of said divided portions is coupled with corresponding said second electrode through the solder,
wherein said two or more divided portions include a large-size portion whose size is relatively large and a small-size portion whose size is relatively small;
wherein said large-size portion is arranged in a central part of said first electrode,
wherein, in a direction in which said two or more divided portions are arranged, said second electrode is offset toward said small-size portion with respect to a center of said first electrode and, in a state where said electronic component is mounted over said wiring substrate, by allowing said solder ball to undergo said reflow, said large-size portion and said small-size portion are coupled to said second electrode.

17. A method for manufacturing an electronic device, comprising the steps of:
mounting, over a wiring substrate having two or more first electrodes over one surface thereof, an electronic component having, over one surface thereof, two or more second electrodes provided corresponding to said two or more first electrodes, at least one of said first electrodes being a specific electrode which is divided into two or more divided portions, said divided portions being coupled to different wirings, respectively, and solder balls being formed over said second electrodes, respectively; and
reflowing said solder ball and coupling each of said second electrodes with said first electrode through the solder,
wherein, in said coupling step, at least one of said divided portions is coupled with corresponding said second electrode through the solder,
wherein, in said coupling step, in a state where said solder ball is reflowed, by holding and moving said chip relatively to said wiring substrate, the solder is allowed to get wet and spread over a desired divided portion of two or more said divided portions of said specific electrode.

18. The electronic device according to claim 1, wherein the gap is a MIN Gap calculated according to:

$$\text{MIN Gap} = S + (K \cdot M/2S) - (L + J/2)$$

where S in the formula is expressed by the following formula:

$$S = (R^2 - (K/2)^2)^{1/2},$$

J is the amount of planar shift between the central position of the second electrode and a central position of the divided portion,
R is a radius of the solder,
K is a height of the solder,
L is a horizontal distance between a central position of the second electrode and an end portion of the divided portion on a side of the divided portion, and
M is a thickness of the divided portion.

19. The wiring substrate according to claim 12, wherein the gap is a MIN Gap calculated according to:

$$\text{MIN Gap} = S + (K \cdot M/2S) - (L + J/2)$$

where S in the formula is expressed by the following formula:

$$S = (R^2 - (K/2)^2)^{1/2},$$

J is the amount of planar shift between the central position of the second electrode and a central position of the divided portion,
R is a radius of the solder,
K is a height of the solder,
L is a horizontal distance between a central position of the second electrode and an end portion of the divided portion on a side of the divided portion, and
M is a thickness of the divided portion.

20. The method for manufacturing an electronic device according to claim 15, wherein the gap is a MIN Gap calculated according to:

$$\text{MIN Gap} = S + (K \cdot M/2S) - (L + J/2)$$

where S in the formula is expressed by the following formula:

$$S = (R^2 - (K/2)^2)^{1/2},$$

J is the amount of planar shift between the central position of the second electrode and a central position of the divided portion,
R is a radius of the solder,
K is a height of the solder,
L is a horizontal distance between a central position of the second electrode and an end portion of the divided portion on a side of the divided portion, and
M is a thickness of the divided portion.

* * * * *